United States Patent
Donachy et al.

(10) Patent No.: US 9,674,979 B2
(45) Date of Patent: Jun. 6, 2017

(54) VARIABLE-DEPTH MULTI DEVICE CHASSIS

(71) Applicant: Dell Products L.P., Round Rock, TX (US)

(72) Inventors: John Charles Donachy, Austin, TX (US); Craig Warren Phelps, Austin, TX (US); Amelia Cosgrove Thomas, Austin, TX (US); Peter Kaltenbach, Austin, TX (US); Orin M. Ozias, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 148 days.

(21) Appl. No.: 14/632,814

(22) Filed: Feb. 26, 2015

(65) Prior Publication Data

US 2016/0255744 A1   Sep. 1, 2016

(51) Int. Cl.
    *H05K 7/14* (2006.01)
    *G11B 23/023* (2006.01)

(52) U.S. Cl.
    CPC ........ *H05K 7/1488* (2013.01); *G11B 23/0236* (2013.01)

(58) Field of Classification Search
    CPC ...... G11B 23/0236; H05K 7/18; H05K 7/183; H05K 7/186; H05K 7/1488; H05K 7/1489
    USPC .......................................................... 211/26
    See application file for complete search history.

(56) References Cited

U.S. PATENT DOCUMENTS

| | | | | |
|---|---|---|---|---|
| 4,087,138 A | * | 5/1978 | McRae | G11B 23/0236 206/387.15 |
| 4,270,817 A | * | 6/1981 | McRae | G11B 23/0236 206/387.15 |
| 4,772,077 A | * | 9/1988 | Beam | G11B 33/0444 206/387.15 |
| 6,247,944 B1 | * | 6/2001 | Bolognia | G06F 1/184 439/157 |
| 6,370,022 B1 | * | 4/2002 | Hooper | G06F 1/187 312/223.2 |
| 6,433,954 B1 | * | 8/2002 | Rinard | G11B 15/6825 206/387.15 |
| 6,666,340 B2 | | 12/2003 | Basinger et al. | |

(Continued)

OTHER PUBLICATIONS https://www.youtube.com/watch?v=3fN2zFDi2CK.

(Continued)

*Primary Examiner* — Korie H Chan
(74) *Attorney, Agent, or Firm* — Haynes and Boone, LLP

(57) ABSTRACT

A multi device system includes a rack with a rack slot. A device chassis is positioned in the rack slot. The device chassis includes first device slot with a first device entrance, and a second device slot with a second device entrance. A first device stop member extends from the device chassis and into the first device slot. The distance between the first device stop member and the first device entrance is adjustable, and the first device stop member is configured to move a first device in the first device slot through the first device entrance. A second device stop member extends from the device chassis and into the second device slot. The distance between the second device stop member and the second device entrance is adjustable, and the second device stop member is configured to move a second device in the second device slot through the second device entrance.

17 Claims, 38 Drawing Sheets

(56) References Cited

U.S. PATENT DOCUMENTS

| | | | |
|---|---|---|---|
| 6,796,833 B2* | 9/2004 | Baker | G11B 33/128 |
| | | | 211/26 |
| 6,935,521 B2 | 8/2005 | Gundlach et al. | |
| 7,009,836 B2 | 3/2006 | Lo | |
| 2009/0152216 A1* | 6/2009 | Champion | G06F 1/183 |
| | | | 211/26 |

OTHER PUBLICATIONS

"42u Standing Server Rack With Adjustable and Sliding Shelves, Power—SW—30046;" pp. 1-3, https://sewelldirect.com/productPrintable.aspx?productsId=28225.

"Mars II Twin Blade D525 Firewall 1U Server," Mars II Twin Blade D525 Firewall 1U Server/Hacom, 2009-2015 pp. 1-4, Hacom, http://hacom.net/catalog/mars-ii-twin-blade-d525-pfsense-1u-server.

"R&S ® ZZA-KN21 19" Adapter," R&S ® ZZA-KN21 19" Rack Adapter (Rohde & Schwarz Middle East and Afirca—Products), p. 1, http://www.rohde-schwarz.ae/en/products/test_and_measurement/signal_generation/ZZAK.

"Two-Device 1U Rugged Rack Mount Hold One Or Two KG-250s Or IPS-250s," ViaSat, 2011-2014, p. 1, ViaSat, Inc.

* cited by examiner

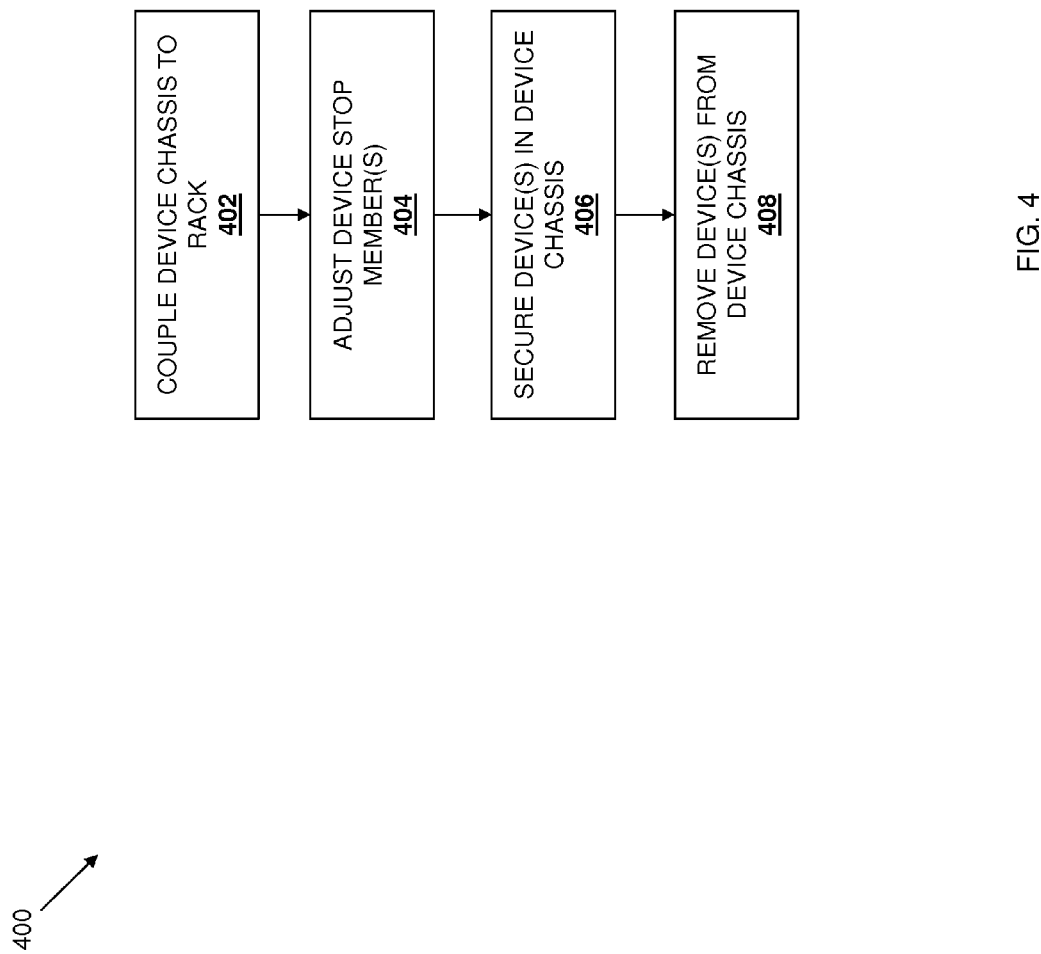

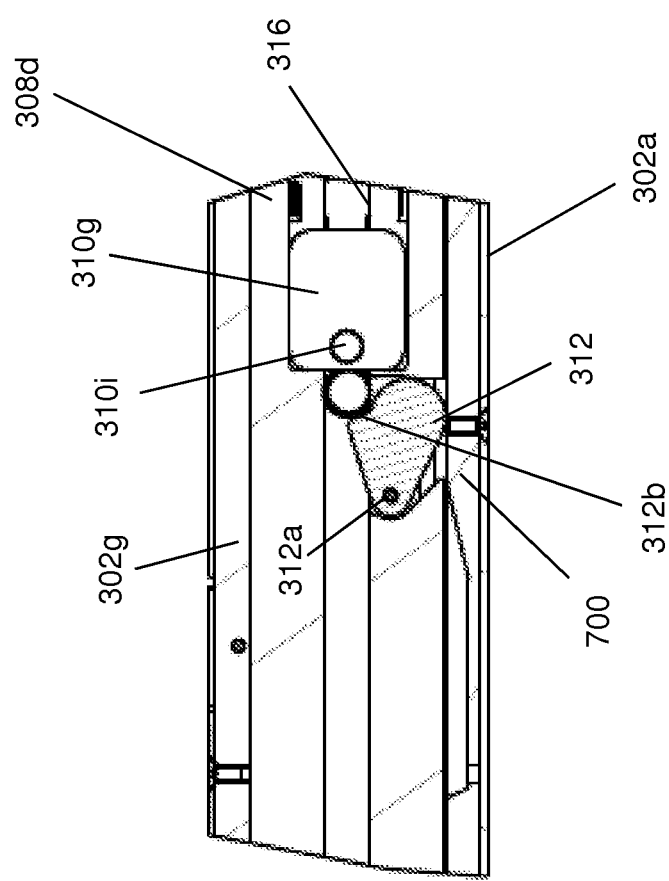

VARIABLE-DEPTH MULTI DEVICE CHASSIS

BACKGROUND

The present disclosure relates generally to information handling systems, and more particularly to a multi device chassis that can accommodate information handling systems with different depths.

As the value and use of information continues to increase, individuals and businesses seek additional ways to process and store information. One option available to users is information handling systems (IHSs). An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some IHSs such as, for example, servers, switches, and/or other devices, are utilized in racks that hold those devices in one or more slots in the rack and provide for the interconnection of the devices to each other. Some devices may be configured to occupy approximately the full width of the slot in the rack ("full width devices"), while some devices may be configured to occupy approximately half the width of the slot in the rack ("half width devices"). To accommodate such half width devices, multi device chassis have been developed that couple to the slot and secure two of the half width devices in the rack in a single slot. Furthermore, some devices may be configured to occupy approximately the full depth of the slot in the rack ("full depth devices"), while some devices may be configured to occupy approximately half the depth of the slot in the rack ("half depth devices"), and some racks may include a half width, full depth device as well as a half width, half depth device. In such situations, the user is required to position the half width, full depth device in a first multi device chassis that is positioned in a first slot on the rack and designed to accommodate two half width, full depth devices, while positioning the half width, half depth device in a second multi device chassis that is positioned in a second slot on the rack and designed to accommodate two half width, half depth devices. As such, space in the rack may be wasted (e.g., when an odd number of either half width, full depth devices or half width, half depth devices are included in the rack, resulting in at least one open half width space in either or both of the first slot and the second slot on the rack.)

Accordingly, it would be desirable to provide an improved multi device chassis.

SUMMARY

According to one embodiment, a multi-device coupling system includes a multi-device chassis that defines a first device slot and a second device slot in a side-by-side orientation; a first device stop member that extends from the multi-device chassis and into the first device slot, wherein a location of the first device stop member along a length of the first device slot is adjustable, and wherein the first device stop member is configured to move a first device that is positioned in the first device slot out of the first device slot; and a second device stop member that extends from the multi-device chassis and into the second device slot, wherein a location of the second device stop member along a length of the second device slot is adjustable, and wherein the second device stop member is configured to move a second device that is positioned in the second device slot out of the second device slot.

BRIEF DESCRIPTION OF THE DRAWINGS

FIG. 4 is a flow chart illustrating an embodiment of a method for coupling devices to a device chassis.

FIG. 8c is a side view illustrating a device being retained into the multi-device chassis of FIGS. 3a-3d.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
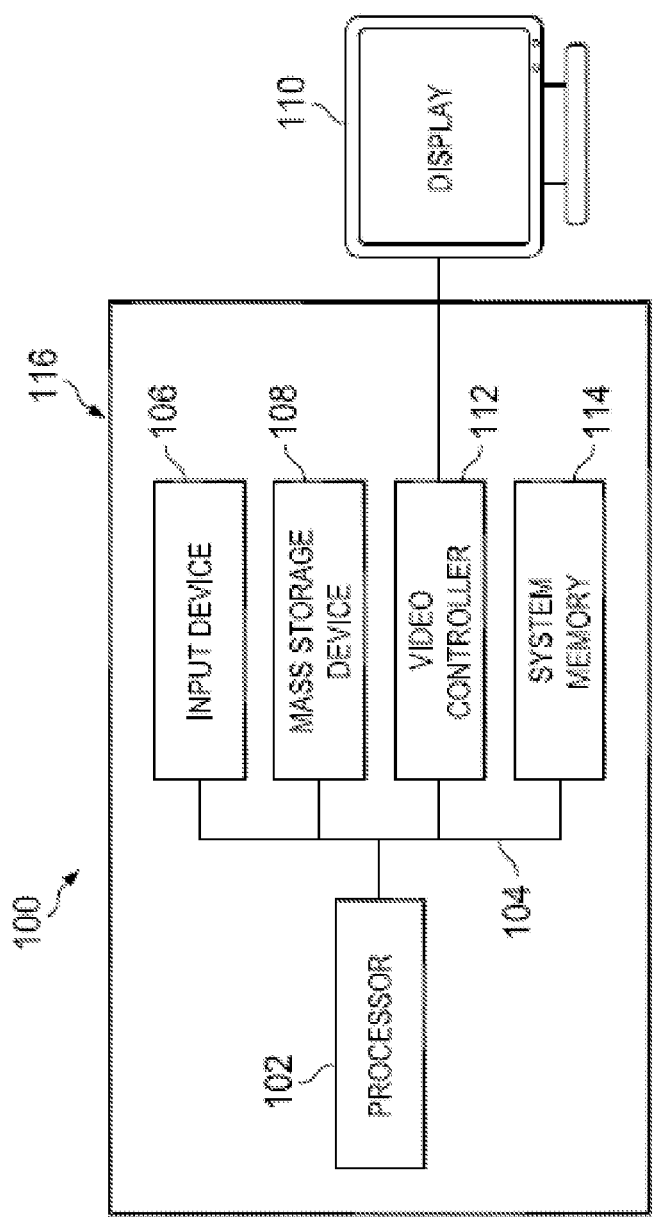
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
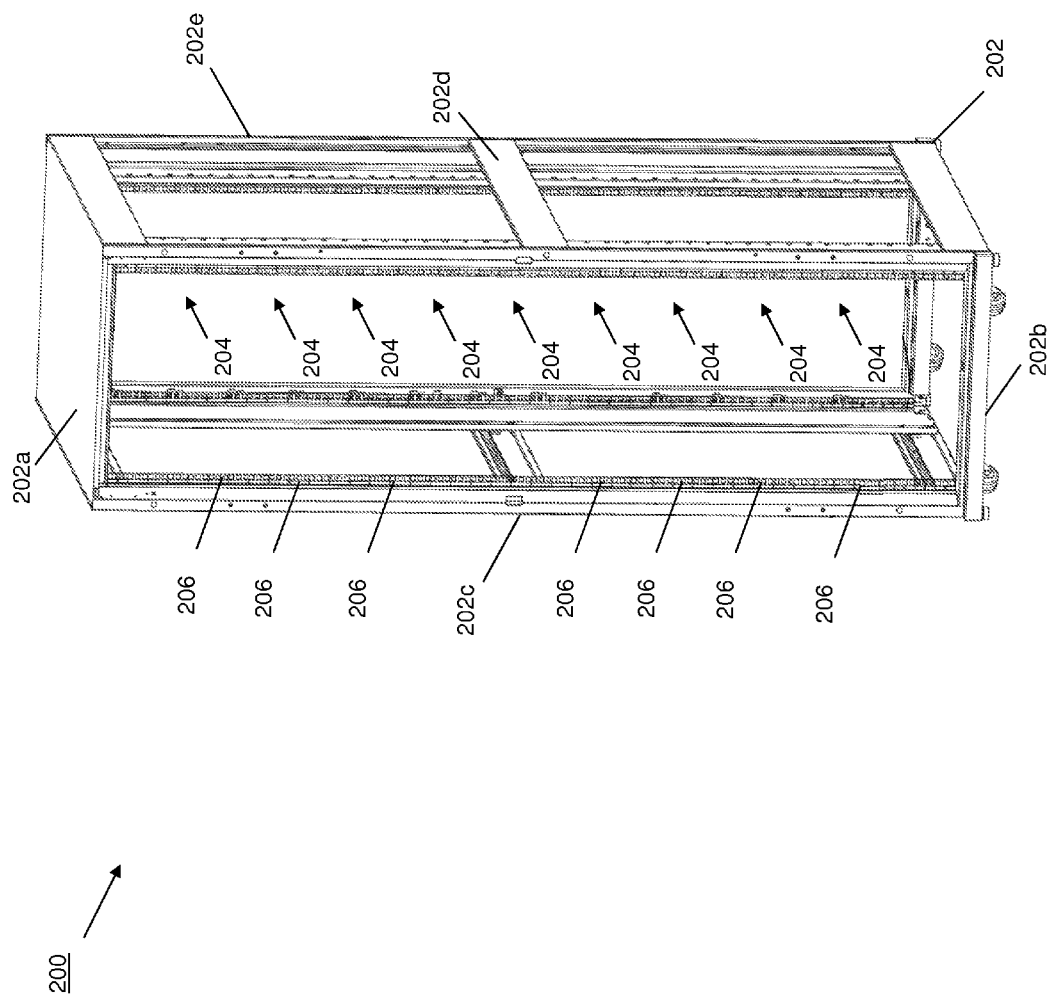
FIG. 2 is a perspective view illustrating an embodiment of a rack.

Referring now to FIG. 2, an embodiment of a rack 200 is illustrated. As discussed in further detail below, the rack 200 is configured to hold a plurality of IHSs such as, for example, the IHS 100 discussed above with reference to FIG. 1. While referred to as a "rack", the rack 200 may be provided by a wide variety of structures known in the art that are configured to hold a plurality of IHSs. The rack 200 includes a rack chassis 202 having a top portion 202a, a bottom portion 202b located opposite the rack chassis 202 from the top portion 202a, a side portion 202c located between the top portion 202a and the bottom portion 202b, a side portion 202d location between the top portion 202a and the bottom portion 202b and located opposite the rack chassis 202 from the side portion 202c, and a rear portion 202e located between the top portion 202a, the bottom portion 202b, and the sides portions 202c and 202d. A plurality of rack slots 204 are defined by the rack chassis 202 between the top portion 202a, the bottom portion 202b, the sides portions 202c and 202d, and the rear portion 202e, by a plurality of IHS coupling features 206 on the rack chassis 202. Each of the rack slots 204 includes a rack entrance that is located opposite the rack slot 204 from the rear portion 202e of the rack chassis 202. As is known in the art, the top portion 202a, the bottom portion 202b, the sides portions 202c and 202d, and/or the rear portions 202e, and/may include features for routing, securing, directing, and/or otherwise coupling devices and device chassis in the device slots 204, as well as cable routing features, security features, and/or other rack features known in the art. As is known in the art, each of the rack slots 204 is may be configured to house a full width device (e.g., a device, such as the IHS 100 of FIG. 1, that is approximately the width of the rack slot 204 (i.e., slightly less than) as measured between the sides portions 202c and 202d).

Referring now to FIGS. 3a, 3b, 3c, 3d, 3e, 3f, 3g, 3h, 3i, 3j, and 3k, an embodiment of a multi-device chassis 300 (hereinafter "device chassis 300") is illustrated. In the illustrated embodiment, the device chassis 300 is illustrated as a multi device chassis that allows two devices to be positioned in and secured to the device chassis 300 in a side-by-side orientation. However, the teachings of the present disclosure may be used to provide more than two devices in a side-by-side orientation, or a plurality of devices in a stacked orientation (i.e., one on top of the other). As such, the specific embodiment illustrated and described below is not meant to limit the teachings of the present disclosure to the illustrated system, and one of skill in the art will recognize that those teachings may be applied to a variety of multi-device scenarios while remaining within the scope of the present disclosure.

Figure 3A:
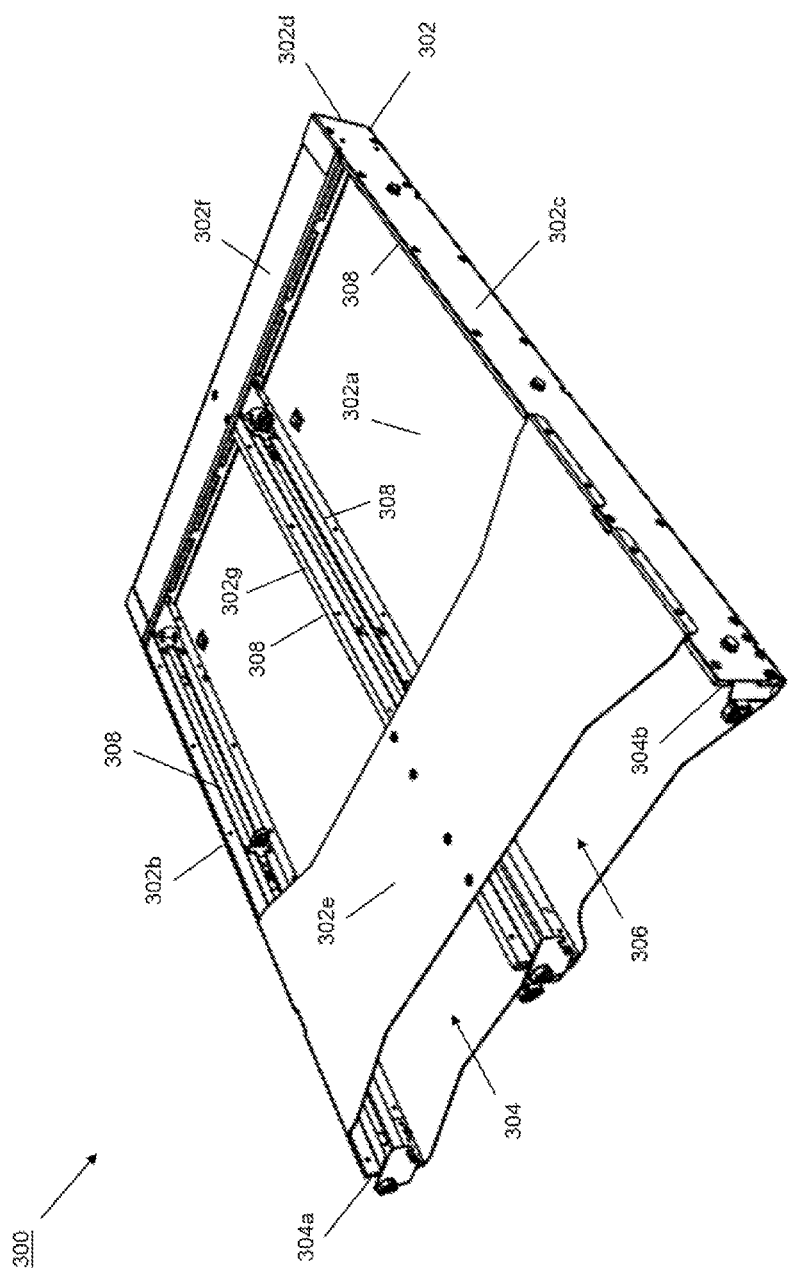
FIG. 3a is a perspective view illustrating an embodiment of a multi-device chassis.

Referring initially to FIG. 3a, the device chassis 300 includes base 302 having a bottom wall 302a, a pair of side walls 302b and 302c that extend from opposite edges of the bottom wall 302a such that they are opposite the base 302 from each other, a rear wall 302d that extends between the bottom wall 302a and the side walls 302b and 302c, a top wall portion 302e that extends between the side walls 302b and 302c opposite the base 302 from the bottom wall 302a, as well as a top wall portion 302f that extends between the side walls 302b and 302c and the rear wall 302d opposite the base 302 from the bottom wall 302a. An intermediate wall 302g extends between the bottom wall 302a, the rear wall 302d, and the top wall portions 302e and 302f, and is located approximately midway between the side walls 302b and 302c. A first device slot 304 is defined between the bottom wall 302a, the top wall portions 302e and 302f, the side wall 302b, the intermediate wall 302g, and the rear wall 302d. The first device slot 304 includes a first device entrance 304a that is located opposite the first device slot 304 from the rear wall 302d of the base 302. A second device slot 306 is defined between the bottom wall 302a, the top wall portions 302e and 302f, the side wall 302b, the intermediate wall 302g, and the rear wall 302d. The second device slot 306 includes a second device entrance 306a that is located opposite the second device slot 306 from the rear wall 302d of the base 302.

While illustrated with an open top (via top wall portions 302e and 302f), the base 302 of the device chassis 300 may completely enclose the first device slot 304 and the second device slot 306, or may include other open walls (e.g., the top wall 302a, the side walls 302b and 302c, the rear wall 302) that are similar to the top wall portions 302e and 302f to provide, for example, cable routing or access as desired. However, in experimental embodiment, the top wall portions 302e and 302f have been found to provide rigidity for the device chassis sufficient for coupling to the devices and the rack, as discussed below, while also providing for access to devices when they are positioned in the device chassis 300 to, for example, access the rear of the device for cabling or other connection features, and for the ability to remove the device from the device chassis 300.

A plurality of device coupling members 308, described in further detail below, are included adjacent the first device slot 304 and the second device slot 306. In the illustrated embodiment, a device coupling member 308 is coupled to the side wall 302b such that it is located between the side wall 302b and the first device slot 304, a device coupling member 308 is coupled to the intermediate wall 302g such that it is located between the intermediate wall 302g and the first device slot 304, a device coupling member 308 is coupled to the intermediate wall 302g such that it is located between the intermediate wall 302g and the second device slot 306, and a device coupling member 308 is coupled to the side wall 302c such that it is located between the side wall 302c and the second device slot 306. In the embodiments illustrated in FIGS. 3a-3d, some features of the device coupling members 308 are not called out for clarity of illustration, and those features are called out and discussed with reference to the other figures below. As discussed below, each of the device coupling members 308 may be substantially similar, and thus the discussion of the structure and operation of the device coupling member 308 below may apply to any of the device coupling members 308 in the device chassis 300. However, that discussion should not be interpreted as limiting the device coupling members 308 in the device chassis 300 to identical device coupling systems, as some modification of the device coupling members 308 (e.g., for different sizes, types, orientations, or designs of device chassis) will fall within the scope of the present disclosure.

Figure 3B:
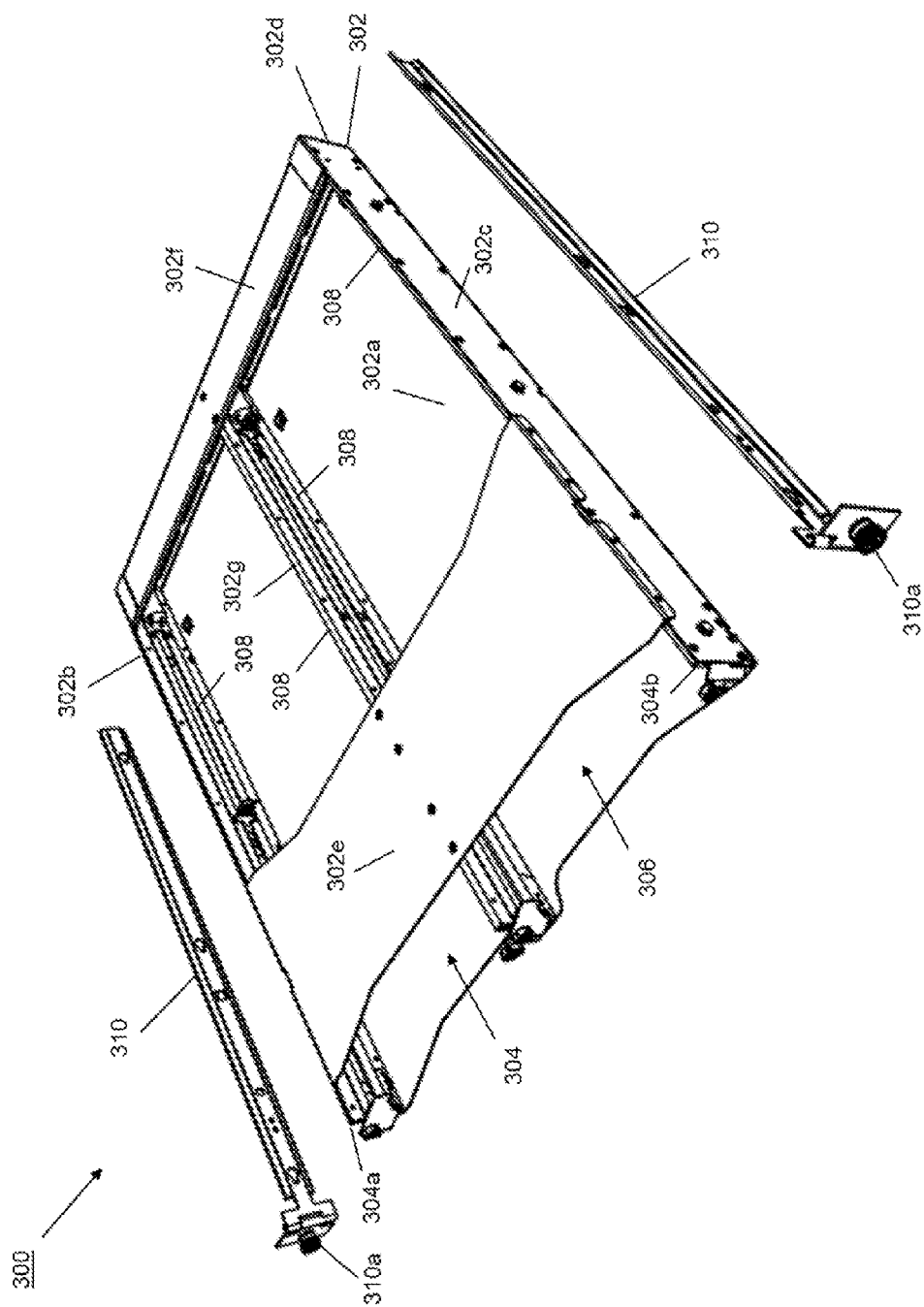
FIG. 3b is a perspective view illustrating an embodiment of a multi-device chassis.
Figure 3C:
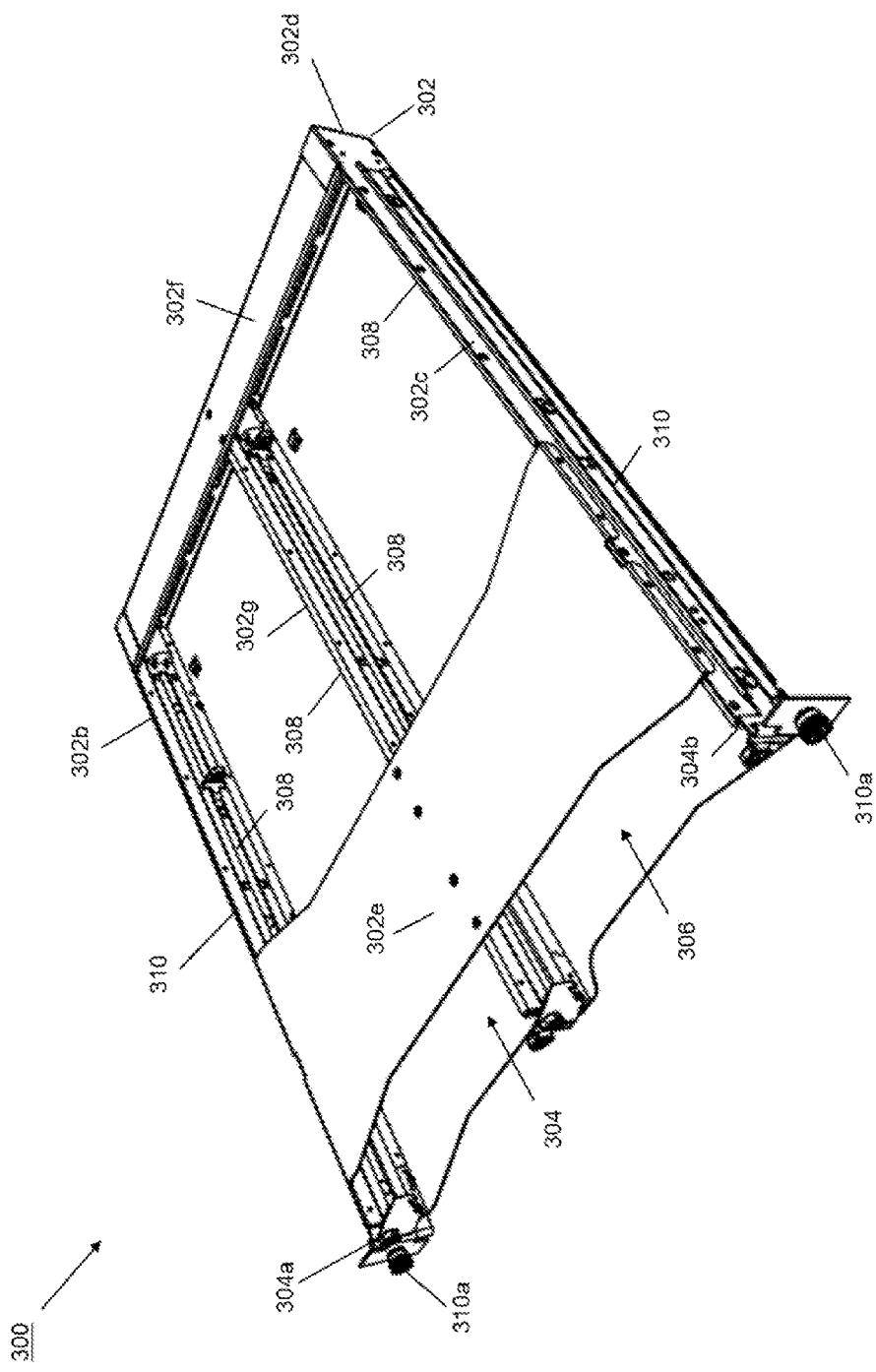
FIG. 3c is a perspective view illustrating an embodiment of a multi-device chassis.

As illustrated in FIGS. 3b and 3c, a plurality of rack couplings 310 may be coupled to the device chassis 300. For example, a rack coupling 310 may be coupled to the side wall 302b opposite the side wall 302b from the first device slot 304, and a rack coupling 310 may be coupled to the side wall 302c opposite the side wall 302c from the second device slot 306. In an embodiment, each of rack couplings 310 includes engagement features for engaging and moveably coupling the device chassis 300 to the rack 200 in one of the rack slots 204, discussed above with reference to FIG. 2, as well as a securing feature 310a for securing the device chassis 300 in one of the rack slots 204. With the rack couplings 310 coupled to the device chassis 300, the device chassis 300 may be moved through one of the rack entrances to be positioned its associated rack slot 204, and secured to the rack chassis 202 by engaging the securing feature 310a with a corresponding feature on the rack chassis 202.

Figure 3D:
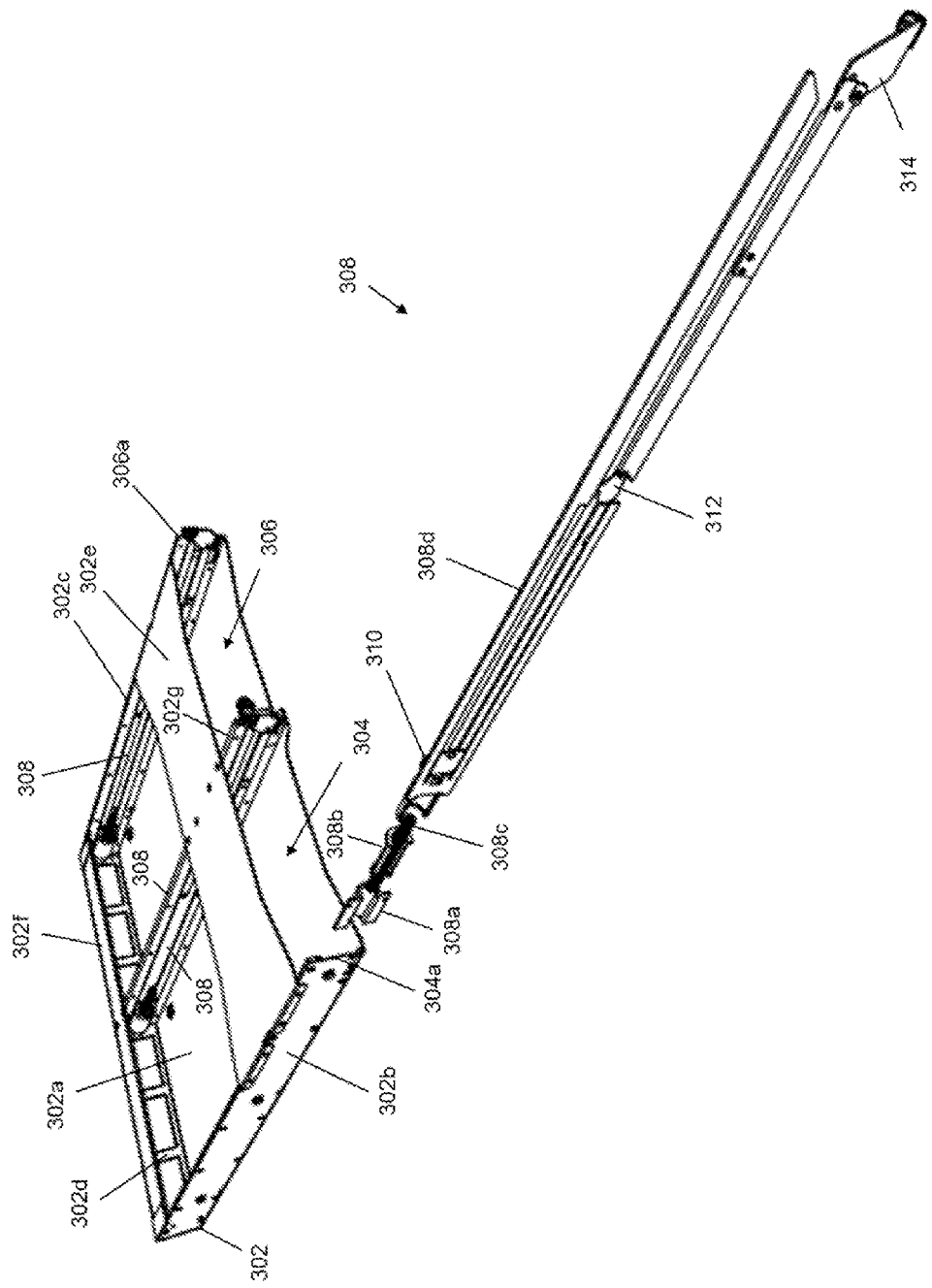
FIG. 3d is a perspective view illustrating an embodiment of a sliding rail on the multi-device chassis of FIGS. 3a-d.
Figure 3E:
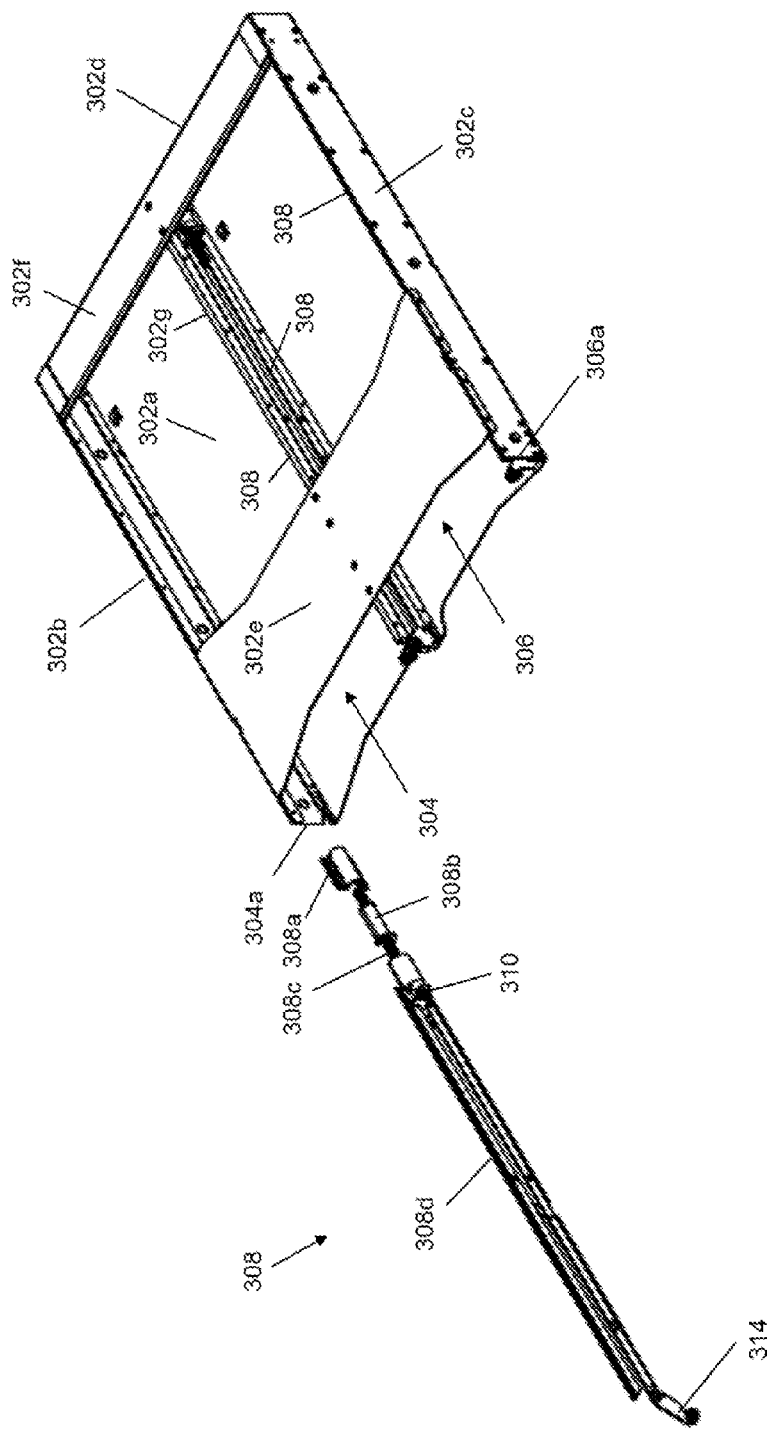
FIG. 3e is a perspective view illustrating an embodiment of a sliding rail on the multi-device chassis of FIGS. 3a-d.

Referring now to FIGS. 3d and 3e, an exploded view of one of the device coupling members 308 is provided. The device coupling member 308 includes an outer spring housing 308a that is mounted, in the illustrated embodiment, to the side wall 302b of the device chassis 300 adjacent the rear wall 302d such that the outer spring housing 308a is located between the side wall 302b and the first device slot 304. An inner spring housing 308b houses a spring 308c and is coupled to the outer spring housing 308a to position the spring 308c in the outer spring housing 308a while allowing the spring to extend out of both the outer spring housing 308a and the inner spring housing 308b. With the inner spring housing 308b positioned in the outer spring housing 308a, the spring 308c may engage the rear wall 302d of the device chassis 300 or other bracing feature (e.g., the outer spring housing 308a or a feature extending from the side wall 302b) to allow the spring to provide the biasing force discussed below.

A sliding rail 308d is moveably coupled, in the illustrated embodiment, to the side wall 302b via, for example, a track on the side wall 302b and track coupling features on the sliding rail 308d that allow the sliding rail 308d to move relative to the side wall 302b such that the sliding rail 308d may be housed in and then extended out of the first device entrance 304a, discussed in further detail below. As discussed below, the sliding rail 308d defines a channel that includes a plurality of stop features that are not clearly visible in FIGS. 3d and 3e. The sliding rail 308a may be coupled to or otherwise engaged with the spring 308c such that the spring 308c may provide a biasing force on the sliding rail 308d that biases the sliding rail 308a towards the first device entrance 304a. In different embodiments, different materials and manufacturing techniques may be used for the sliding rail 308d, including injection molding plastic materials to produce the sliding rails 308d, forming sheet metal to produce the sliding rails 308d, casting or forging metal materials to produce the sliding rails 308d, extruding and machining metals or plastics to produce the sliding rails 308d, and/or a variety of other manufacturing techniques on a variety of other materials known in the art.

A device stop member 310 is moveably coupled to the sliding rail 308a. In the embodiments illustrated in FIGS. 3d and 3e, some features of the device stop member 310 are not called out for clarity of illustration, and those features are called out and discussed with reference to the other figures below. A device retention member 312 is moveably coupled to the sliding rail 308a. In the embodiments illustrated in FIGS. 3d and 3e, some features of the device retention member 312 are not called out for clarity of illustration, and those features are called out and discussed with reference to the other figures below. A latch 314 is moveably coupled to an end of the sliding rail 308a (e.g., the end of the sliding rail 308a that is opposite the end of the sliding rail 308d that engages the spring 308c in the illustrated embodiment). In the embodiments illustrated in FIGS. 3d and 3e, some features of the latch 314 are not called out for clarity of illustration, and those features are called out and discussed with reference to the other figures below. While in the embodiments discussed below, the sliding rails move relative to the device chassis 300, one of skill in the art in possession of the present disclosure will recognize that the sliding rails may be replaced with fixed rails (i.e., not moveable relative to the device chassis 300), and the devices may engage the fixed rails to couple the devices to the device chassis 300 similarly as described below. However, in experimental embodiments, sliding rails have been found to provide benefits with regard to coupling devices to the device chassis 300, as well as enabling different types of devices to be coupled to the device chassis (due to the modularity of the sliding rails).

Figure 3F:
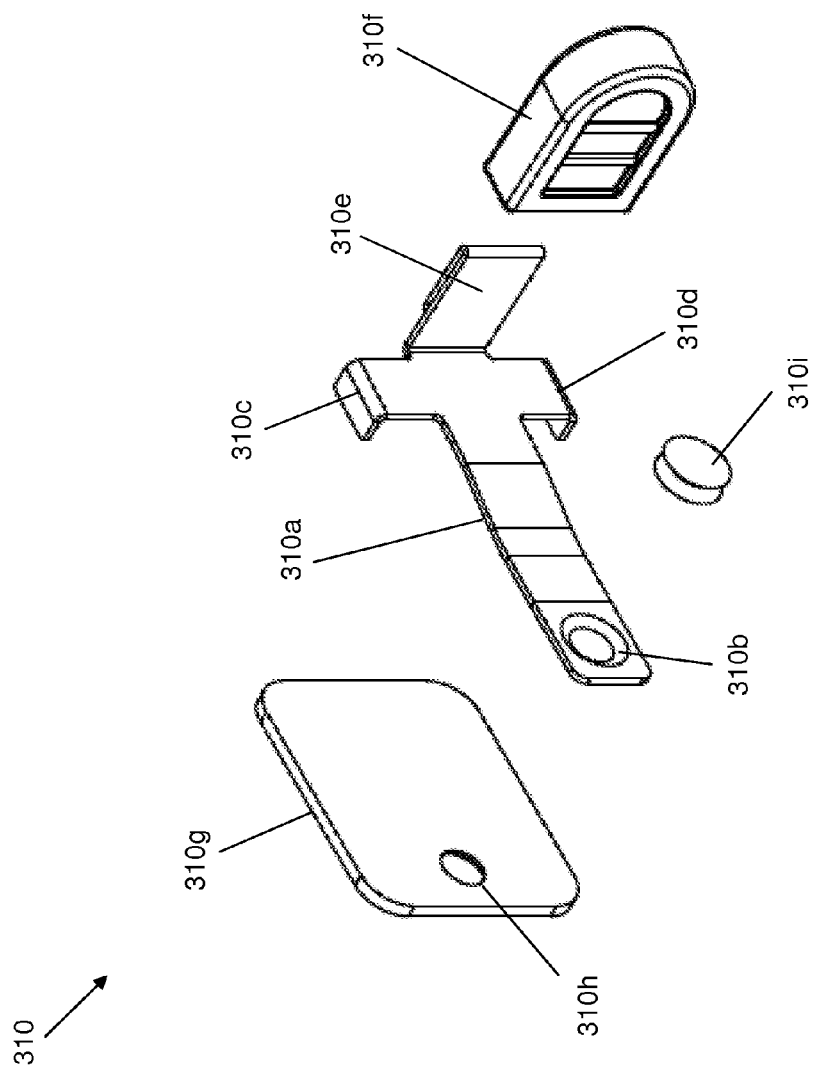
FIG. 3f is an exploded perspective view illustrating an embodiment of a device stop member on the multi-device chassis of FIGS. 3a-d.
Figure 3G:
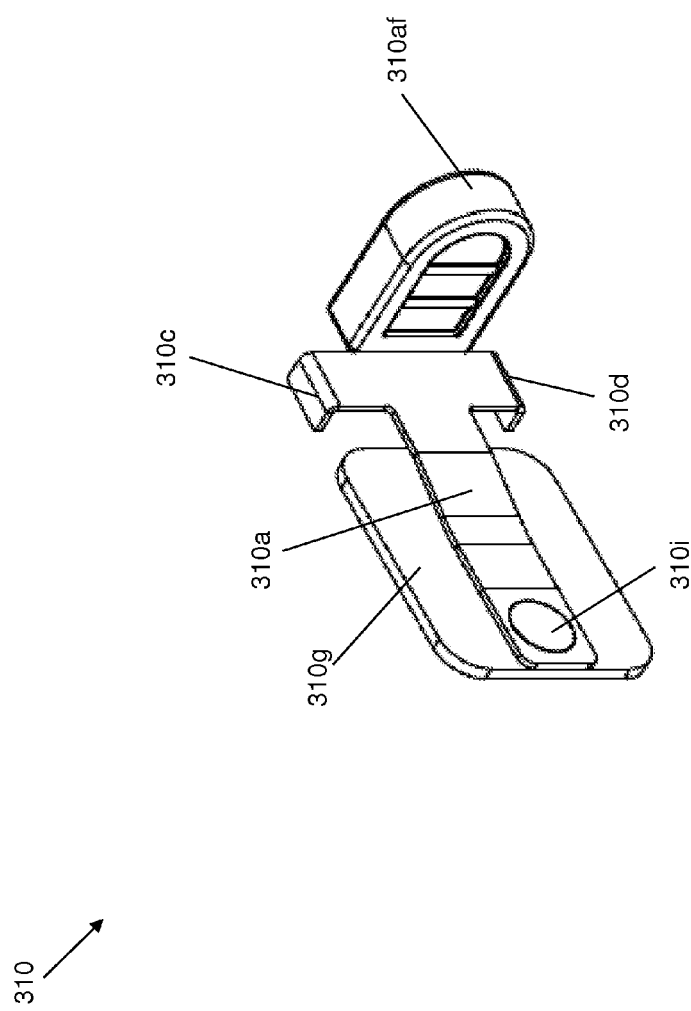
FIG. 3g is a perspective view illustrating an embodiment of the device stop member of FIG. 3g.

Referring now to FIGS. 3f and 3g, an embodiment of the device stop member 310 is illustrated. The device stop member 310 includes a securing base 310a defining a coupling aperture 310b on a first end. A pair of securing members 310c and 310d extend from opposite sides of a second end of the securing base 310a, and a handle coupling 310e extends from the second end of the securing base 310a in a substantially perpendicular orientation to the securing base 310a and the securing members 310c. The device stop member 310 includes a handle 310f that may be coupled to the handle coupling 310e, and a slide plate 310g that defines an aperture 310h. A rivet 310i may be used to couple the device stop member 310 to the sliding rail 308d by positioning the rivet 310i in each of the apertures 310b and 310h (illustrated in FIG. 3g without the sliding rail 308d present) when the securing base 310a and the slide plate 310g are located on opposite sides of the sliding rail 308d, as discussed in further detail below.

Figure 3H:
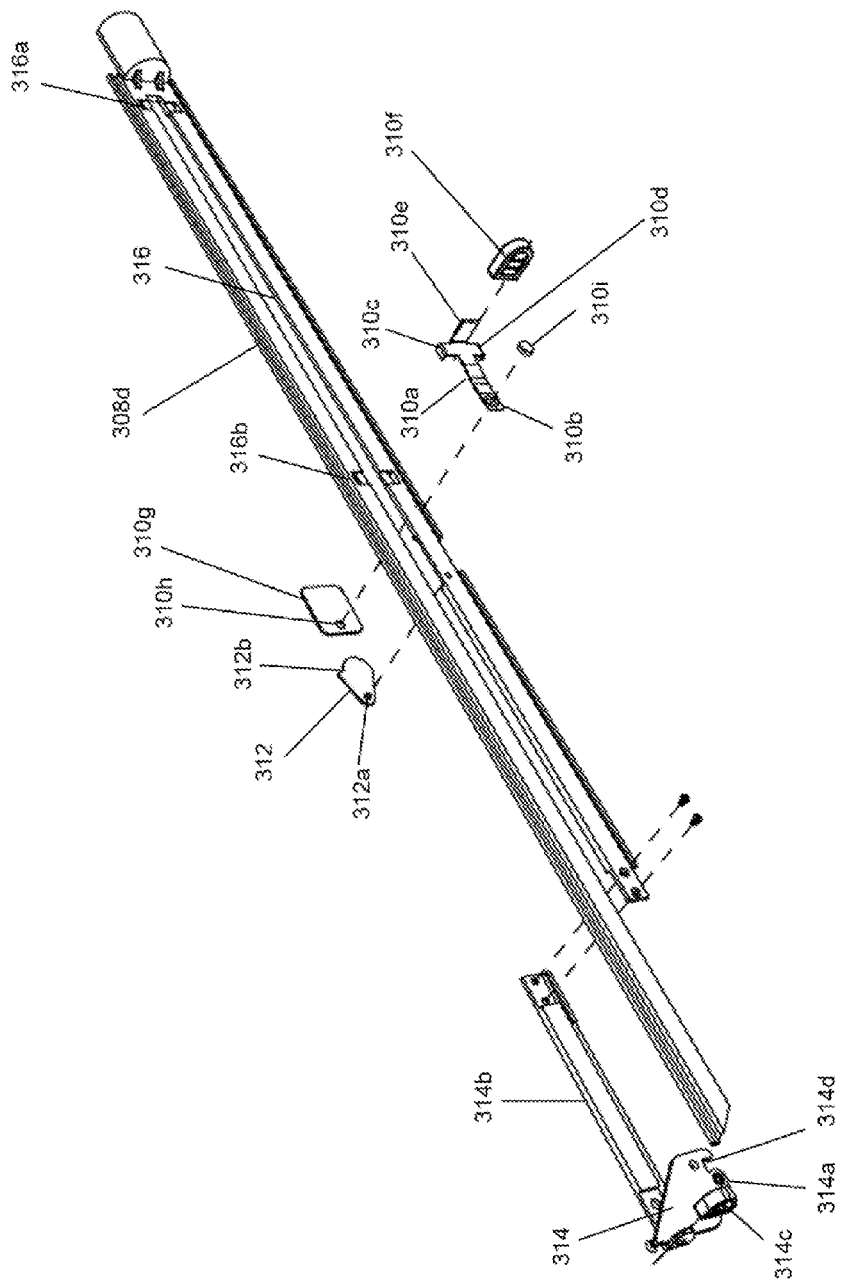
FIG. 3h is an exploded perspective view illustrating an embodiment of a portion of the sliding rail of FIGS. 3e and 3f with related components.
Figure 3I:
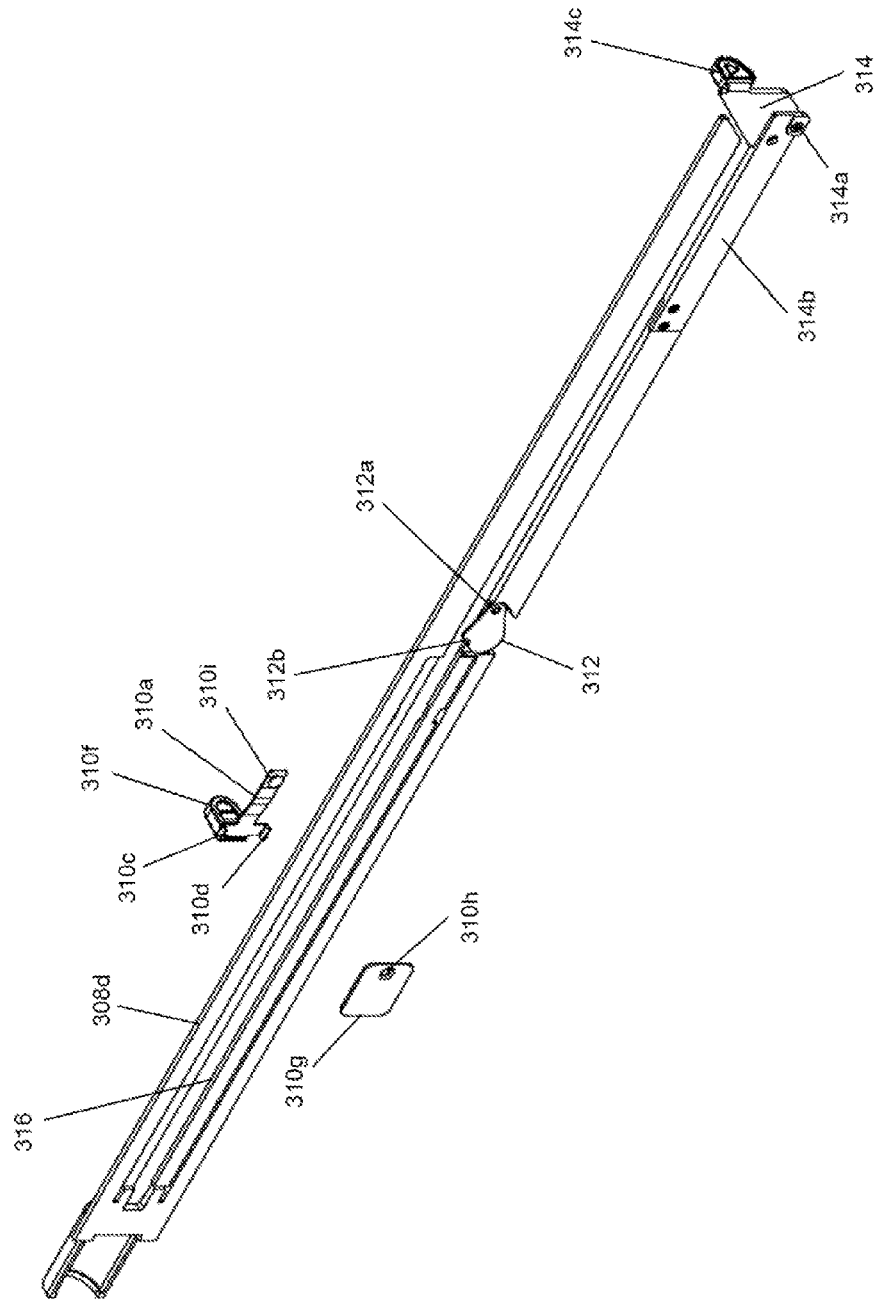
FIG. 3i is a partially exploded perspective view illustrating an embodiment of the sliding rail of FIGS. 3e and 3f with related components.
Figure 3J:
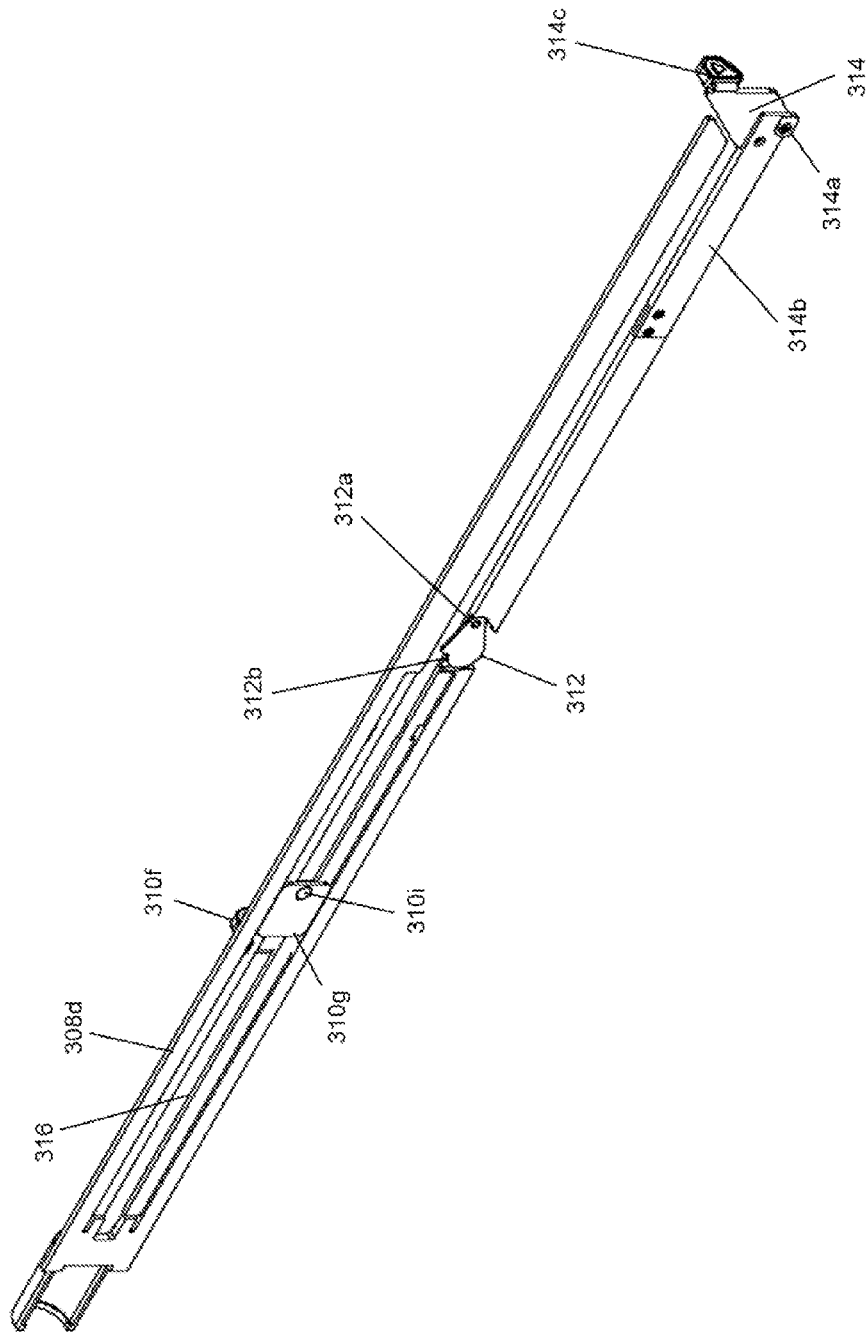
FIG. 3j is a perspective view illustrating an embodiment of the portion of the sliding rail of FIGS. 3e and 3f with related components.

Referring now to FIGS. 3h, 3i, and 3j, the sliding rail 308d is illustrated with some of the features discussed above. FIG. 3h illustrates how the sliding rail 308d defines a channel 316 including full depth stop features 316a that are located an end of the sliding rail 308d, and half depth stop features 316b that are located approximately halfway along the length of the sliding rail 308d. While only two stop features are illustrated, the channel 316 may include any number of stop features, and/or other types of stop features that allow the device stop member to be moved to and secured along any portion of the length of the sliding rail 308d, discussed in further detail below.

FIG. 3h illustrates the device retention member 312 that includes a pivotal coupling 312a and a device engagement surface 312b, discussed in further detail below. As illustrated in FIG. 3i, the device retention member 312 may be moveably coupled to the sliding rail 308d via the pivotal coupling 312a. FIG. 3h also illustrates the latch 314 that includes a pivotal coupling 314a to a sliding rail coupling 314b, as well as a handle 314c and a cam mechanism 314d, discussed in further detail below. As illustrated in FIG. 3i, the latch 314 may be coupled to the sliding rail 308d through the connection of the sliding rail coupling 314b to the sliding rail 308a (e.g., via screws in the illustrated embodiment). FIGS. 3h, 3i, and 3j also illustrated the device stop member 310, with FIG. 3i illustrating how the handle 310f may be coupled to the handle coupling 310e, and the securing base 310a placed on an opposite side of the sliding rail 308d from the slide plate 310g. As illustrated in FIG. 3i, the slide plate 310g may then be positioned in a track defined by the sliding rail 308d, and coupled to the securing base 310 substantially as discussed above by extending the rivet 310i through the apertures 310b, 310h, and the channel 316 defined by the sliding rail 308d. The coupling of the slide plate 310g to the securing base 310 in this manner allows the device stop member 310 to move along at least a portion of the length of the sliding rail 308d (e.g., through the channel 316), as discussed in further detail below. In some embodiment, a detent feature may be provided between the latch 314 and the sliding rail 308d in order to retain the latch 314 in a latched position, discussed in further detail below.

Referring now to FIG. 4, a method 400 for coupling devices to a chassis is illustrated. The method 400 begins at block 402 where the device chassis is coupled to the rack. In an embodiment, the device chassis 300 illustrated in FIG. 3c (e.g., including the rack couplings 310) is moved through the rack entrance of one of the plurality of rack slots 204 in the rack chassis 202 such that it enters that rack slot 204. For example, the device chassis 300 may be aligned with a rack entrance on a rack slot 204 such that the rack couplings 310 on the device chassis 300 are aligned with coupling features (e.g., tracks) on the rack chassis 202 adjacent the rack slot 204, and moved through the rack entrance such that the rack couplings 310 engage the coupling features on the rack chassis 202. Following engagement of the rack couplings 310 with the coupling features on the rack chassis 202, further movement of the device chassis 300 through the rack slot 204 is guided by that engagement until the device chassis 300 is fully seated in the rack slot 204 and the securing features 310a may be engaged with the rack chassis 202 to secure the device chassis 300 to the rack 200. As such, a user may select one of the rack slots 204 in the rack 200 that they would like to position half-width devices, and perform block 402 of the method 400 to couple the device chassis 300 to the rack 200 as described above. Furthermore, a plurality of the device chassis 300 may be coupled to different rack slots 204 in the rack 200 if the user would like to position additional half-width devices in the rack 200. One of skill in the art in possession of the present disclosure will recognize that while the teachings of the present disclosure provide a device chassis 400 that is coupled to a conventional rack to enable the coupling of devices to the device chassis 300/rack, the features discussed above on the device chassis 300 may be integrated into a rack/rack chassis such that half width devices may be directed coupled to the rack 200 without the use of the device chassis 300 while remaining within the scope of the present disclosure.

Figure 5A:
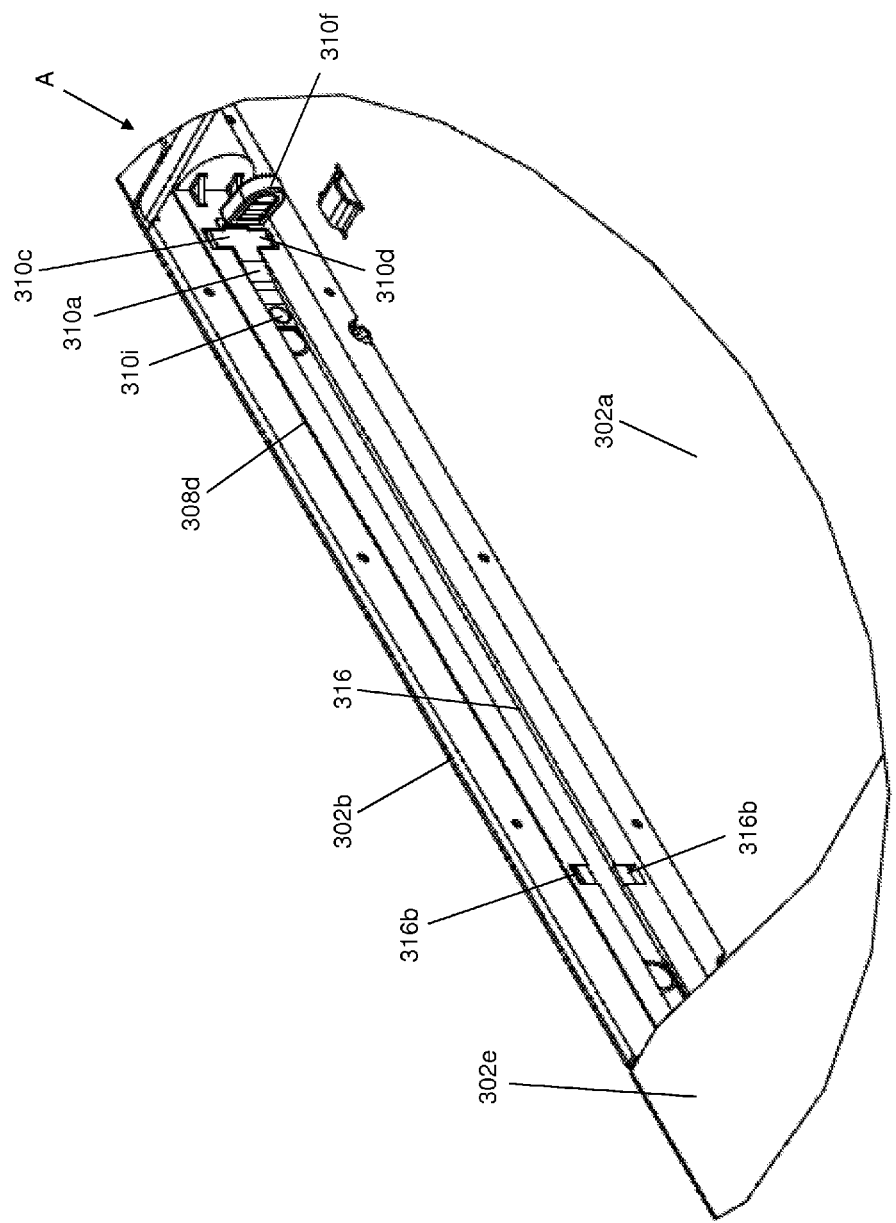
FIG. 5a is a perspective view illustrating an embodiment of a device stop member secured in a first position in the multi-device chassis of FIGS. 3a-3d.
Figure 5B:
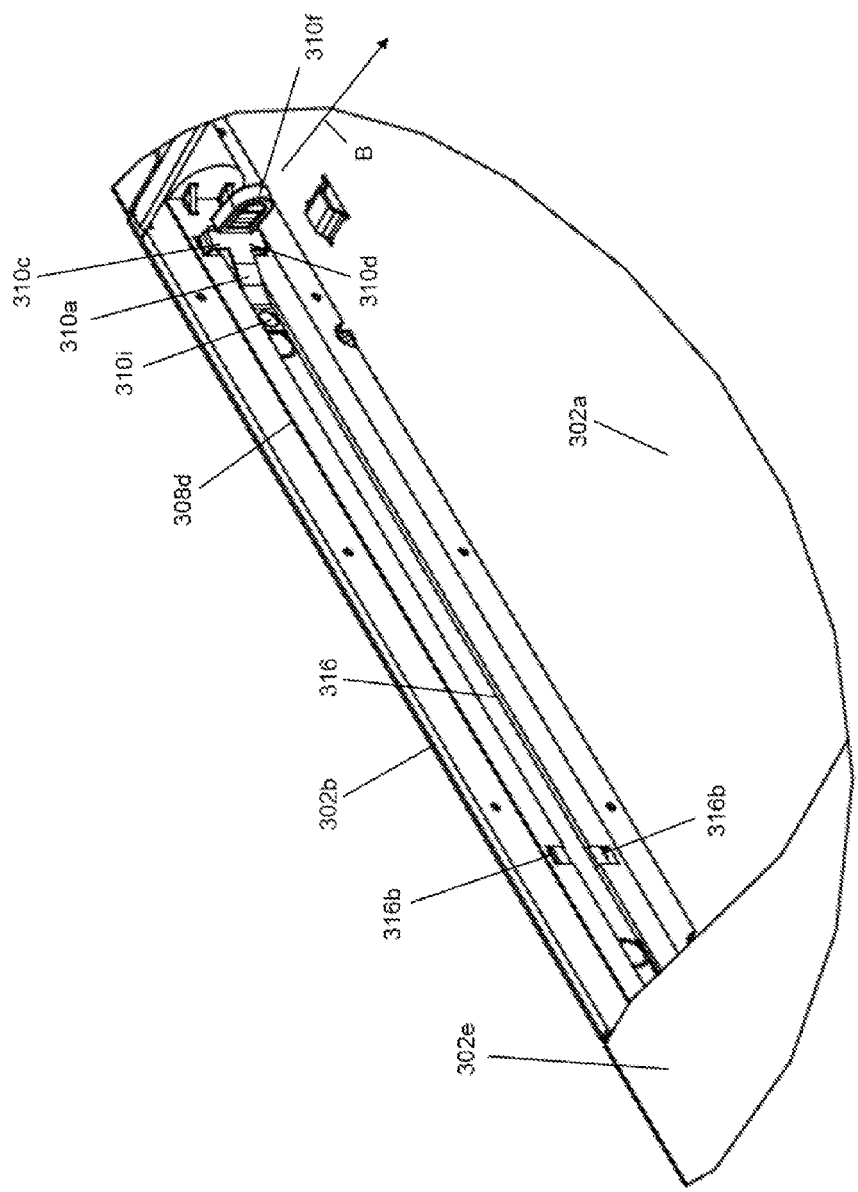
FIG. 5b is a perspective view illustrating an embodiment of the device stop member of FIG. 5a being moved from the first position in the multi-device chassis of FIGS. 3a-3d.
Figure 5C:
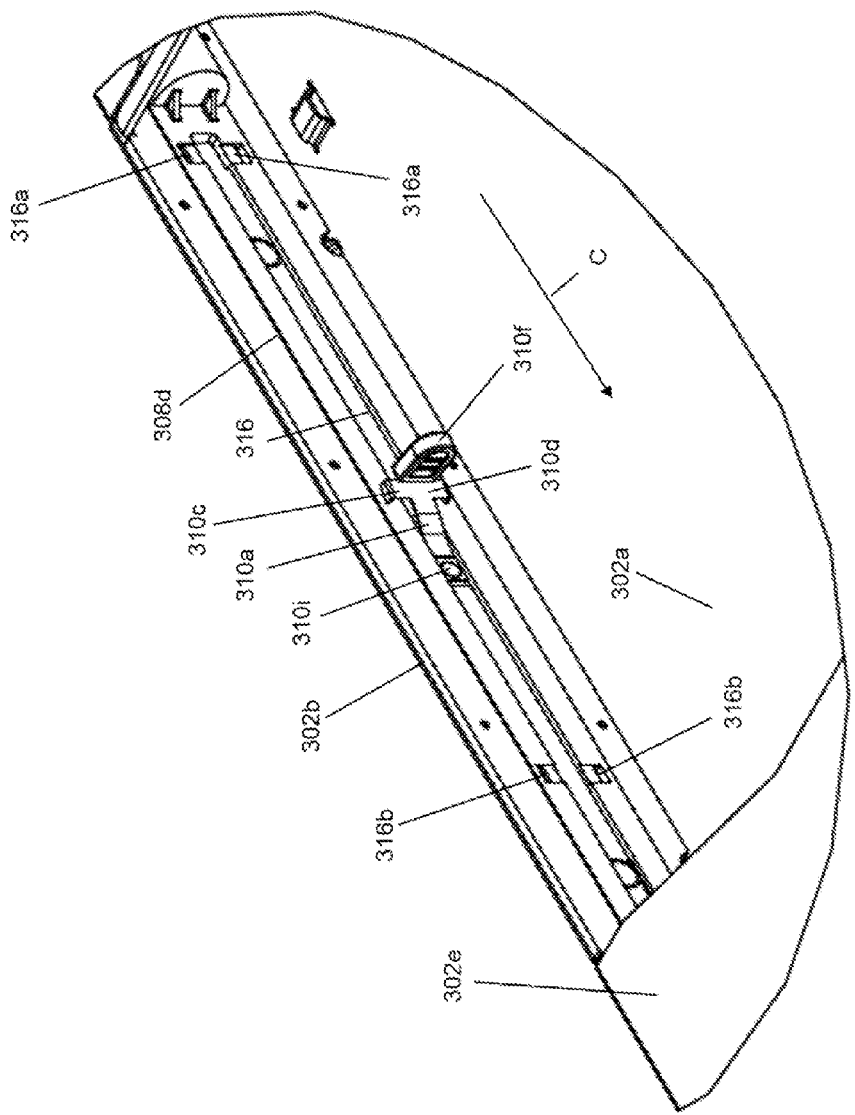
FIG. 5c is a perspective view illustrating an embodiment of the device stop member of FIG. 5a moved to a second position in the multi-device chassis of FIGS. 3a-3d.
Figure 5D:
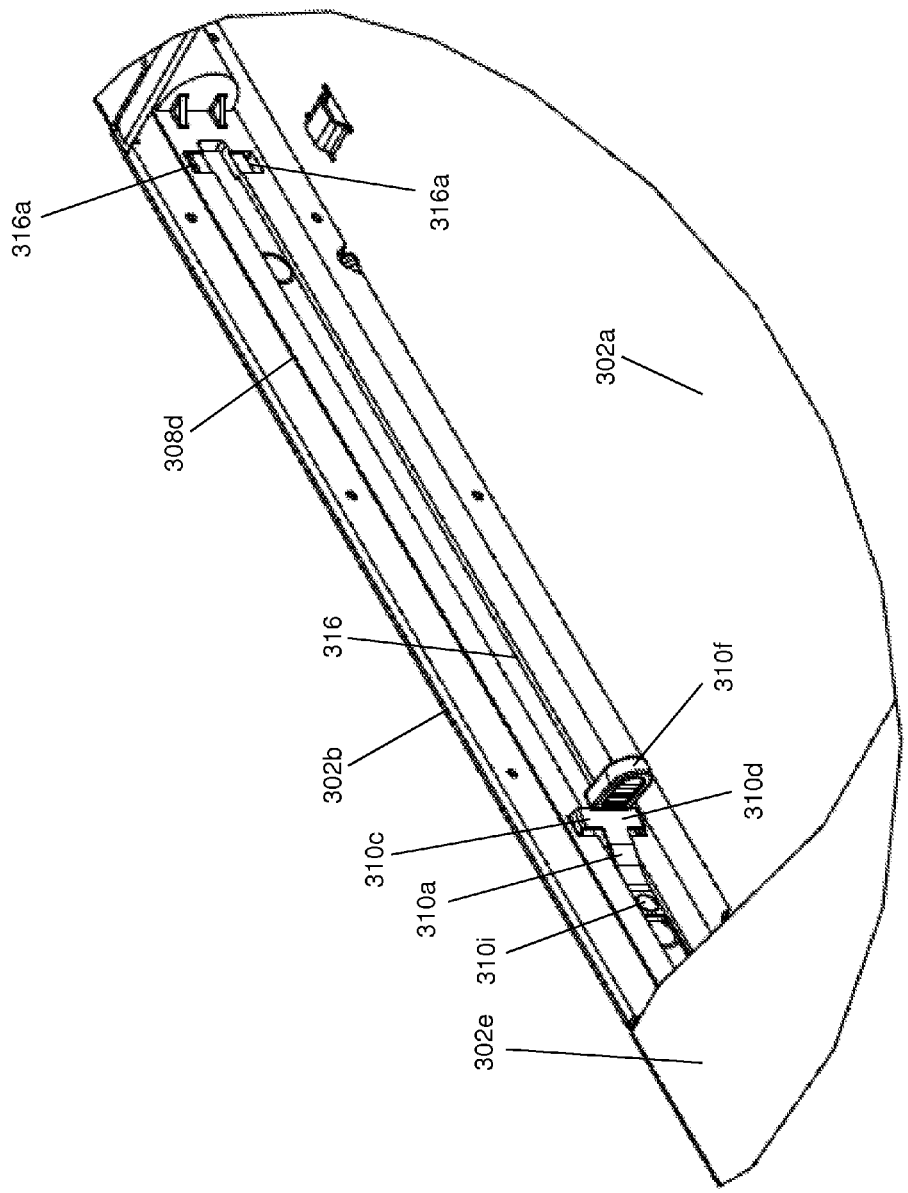
FIG. 5d is a perspective view illustrating an embodiment of the device stop member of FIG. 5c moved to a second position in the multi-device chassis of FIGS. 3a-3d.
Figure 5E:
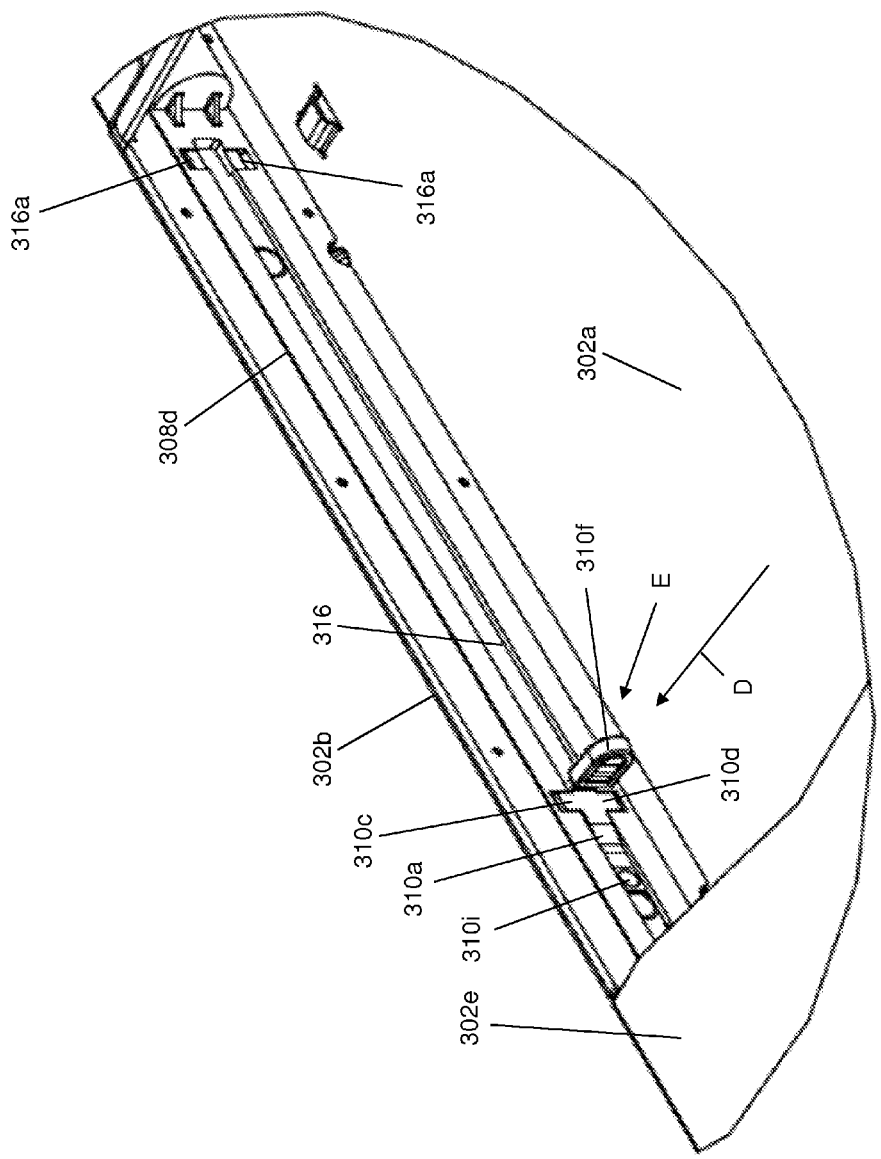
FIG. 5e is a perspective view illustrating an embodiment of the device stop member of FIG. 5a secured in the second position in the multi-device chassis of FIGS. 3a-3d.

The method 400 then proceeds to block 404 where device stop member(s) are adjusted. Referring now to FIGS. 5a, 5b, 5c, 5d, and 5e, an embodiment of adjusting a device stop member 310 on a device coupling member 308 is illustrated. In the illustrated embodiment, the device stop member 310 is secured in a first position A along the length of the sliding rail 308d due to the securing members 310c and 310d on the securing base 310a being seated in the full depth stop feature 316a of the channel 316 defined by the sliding rail 308d, as illustrated in FIG. 5a. In the first position A, the device stop member 310 is configured to operate with a half width, full depth device, as discussed in further detail below. In order to adjust the position of the device stop member 310, a user may engage the handle 310f and move the device stop member 310 in a direction B in order to cause the securing members 310c and 310d on the securing base 310a to become unseated from the full depth stop feature 316a of the channel 316 defined by the sliding rail 308d, as illustrated in FIG. 5b. The user may then use the handle 310f to move the device stop member 310 in a direction C, and with the securing members 310c and 310d unseated from the full depth stop feature 316a, the device stop member 310 will move through the channel 316 defined by the sliding rail 308d, as illustrated in FIG. 5c. The user may continue to move the device stop member 310 in the direction C until the securing members 310c and 310d on the securing base 310a are located adjacent the half depth stop feature 316b of the channel 316 defined by the sliding rail 308d, as illustrated in FIG. 5d. The user may then release the handle 310f to allow the device stop member 310 to move in a direction D such that the securing members 310c and 310d on the securing base 310a become seated in the half depth stop feature 316b of the channel 316 defined by the sliding rail 308d to secure the device stop member 310 in a second position E along the length of the sliding rail 308d, as illustrated in FIG. 5e. In the second position E, the device stop member 310 is configured to operate with a half width, half depth device, as discussed in further detail below. Adjustment of the device stop member 310 from the second position E to the first position A operates in the reverse of that discussed above (e.g., unseat the device stop member 310 from the half depth stop feature 316b, move the device stop member 310 adjacent the full depth stop feature 316a, and seat the device stop member 310 in the full depth stop feature 316a). While the securing of the device stop member 310 in the stop features 316b and 316c is illustrated and described using the securing members 310c and 310d, other features may be used to provide similar functionality. For example, a plunger or other device may be extendable from the device stop member 310 to engage stop features in the channel 316 and provide the functionality discussed above.

Thus, a user may adjust device stop members 310 on the device chassis 300 to configure each of the first device slot 304 and the second device slot 306 in the device chassis 300 to operate with either half width, full depth devices or half width, half depth devices. In the illustrated embodiment, the user may adjust the device stop members 310 on each side of a device slot (e.g., e.g., the device stop members 310 extending from the side wall 302b and the intermediate wall 302g and into the first device slot 304) in which a device is to be positioned. However, in some embodiments, a single device stop member 310 may be sufficient to configure a device slot to receive a device and provide the functionality discussed below. Furthermore, as discussed above, while the illustrated embodiment only includes features for either half width, full depth devices or half width, half depth devices, features that provide for the movement and securing of the device stop members at any location along the length of the sliding rail 308d that is needed to accommodate a device (e.g., a half width, ¾ depth device, a half width, ¼ depth device, any half width device with a depth less than the full depth of the rack slot/device slot, etc.) are envisioned as falling within the scope of the present disclosure. As such, at block 404, the user may adjust the device stop members 310 for any device slot in any device chassis 300 in the rack 200 to accommodate a half width device with a depth for which the device slot is not currently configured.

Figure 6A:
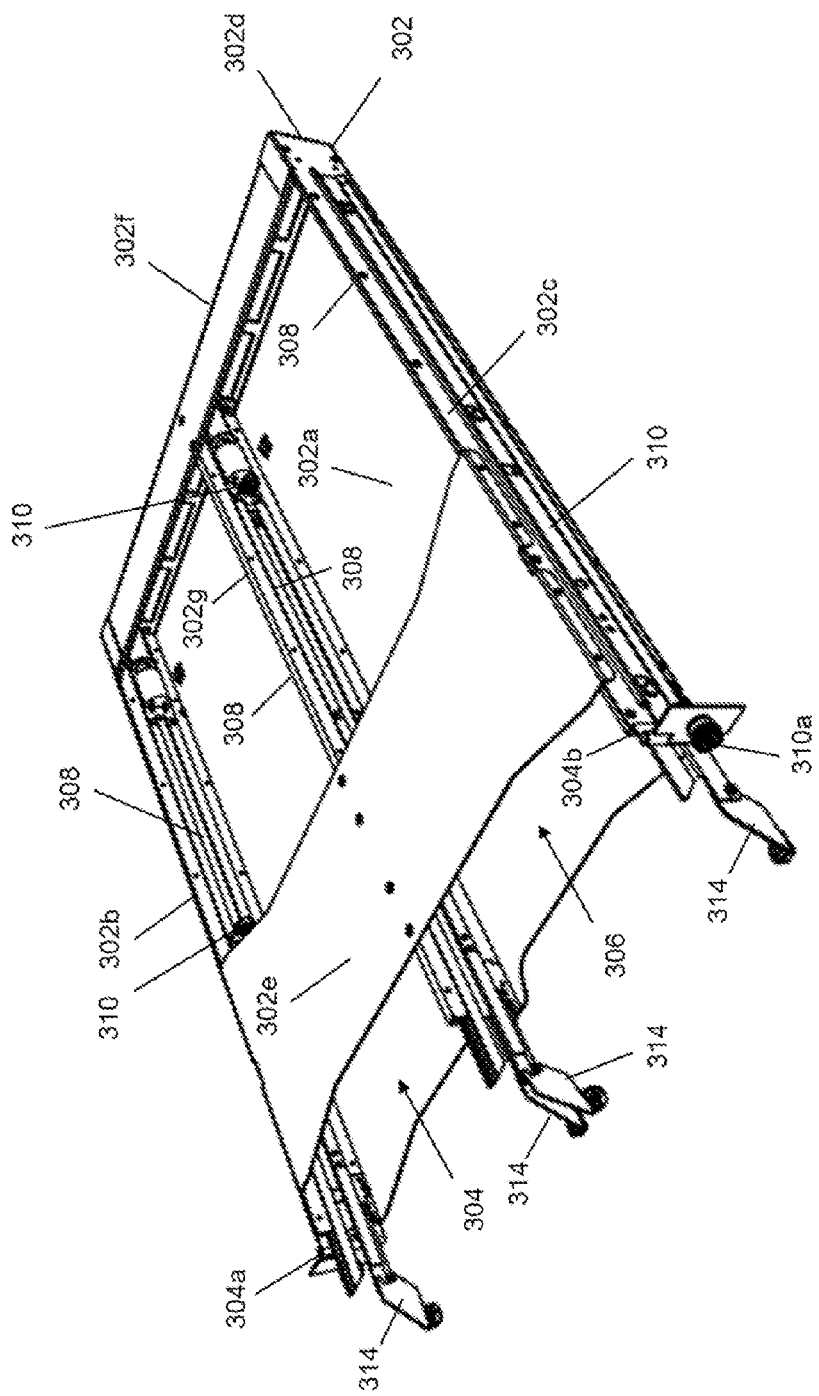
FIG. 6a is a perspective view illustrating the multi-device chassis of FIGS. 3a-3d prepared for receiving devices.

The method 400 then proceeds to block 406 where device(s) are secured in the device chassis. Referring now to FIGS. 6a, 6b, 6c, 6d, 6e, and 6f, a plurality of devices are illustrated as being secured in a device chassis. Furthermore, FIGS. 7a, 7b, 7c, 7d, 7e, 8a, 8b, 8c, 9a, 9b, 9c, 10a, 10b, 10c, and 11 are provided to show detail of the functioning of the components of the device chassis 300 in securing devices in the device chassis 300. Referring first to the embodiment illustrated in FIG. 6a, the first device slot 304 on the device chassis 300 has been configured at block 404 for half depth devices by adjusting the device stop members 310 as discussed above, while the second device slot 306 on the device chassis 300 has been configured at block 404 for full depth devices by adjusting the device stop members 310 as discussed above. As can be seen in FIG. 6a, with no devices in the first device slot 304 and the second device slot 306, the springs 308c provide the biasing force on the sliding rails 308d that moves the sliding rails relative to the device chassis 300 along the moveable coupling therebetween, and causes the ends of the sliding rails 308d (e.g., the ends of the sliding rails 308d to which the latches 314 are coupled) to extend past the first device entrance 304a and the second device entrance 306a. The device chassis 300 may be prepared to receive devices by rotating the latches 314 about their pivotal couplings 314a such that each of the latches are in an unlatched position, illustrated in FIG. 6a.

Figure 6B:
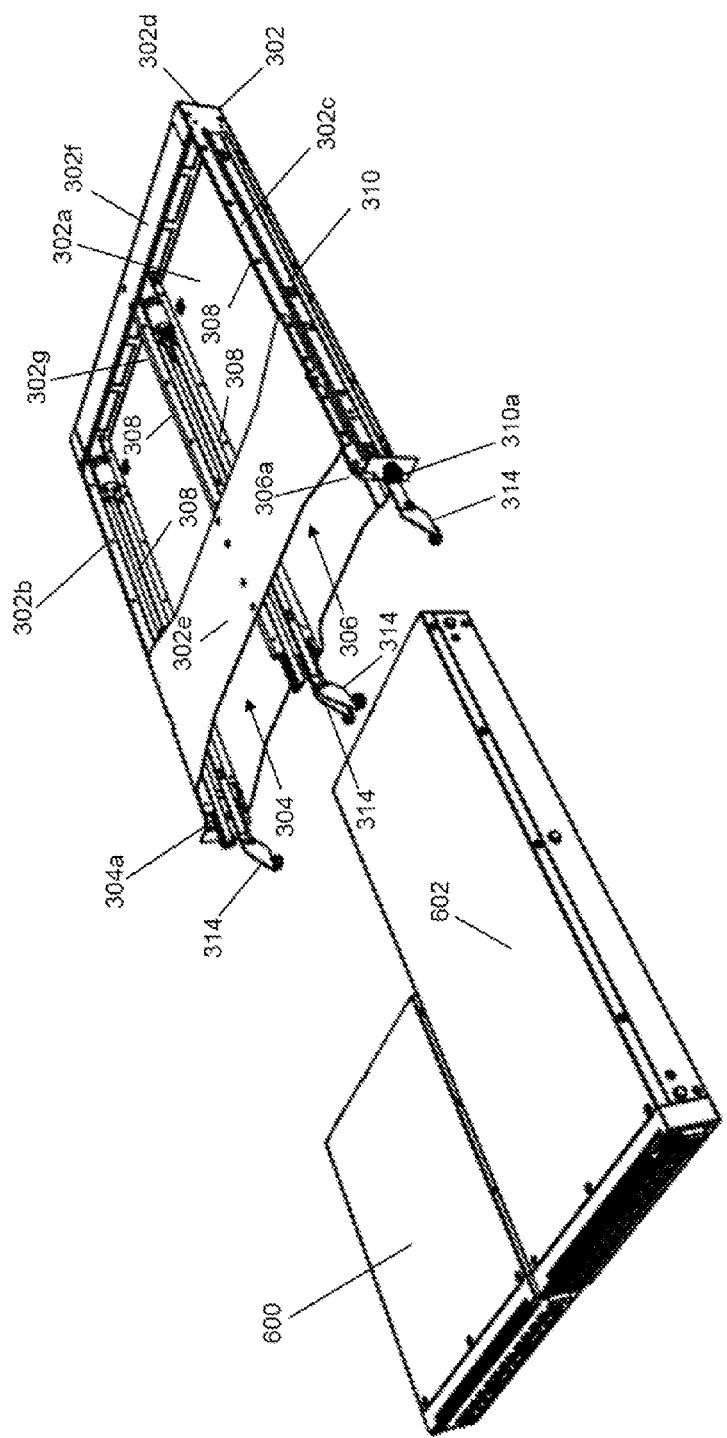
FIG. 6b is a perspective view illustrating devices being moved into the multi-device chassis of FIGS. 3a-3d.
Figure 7A:
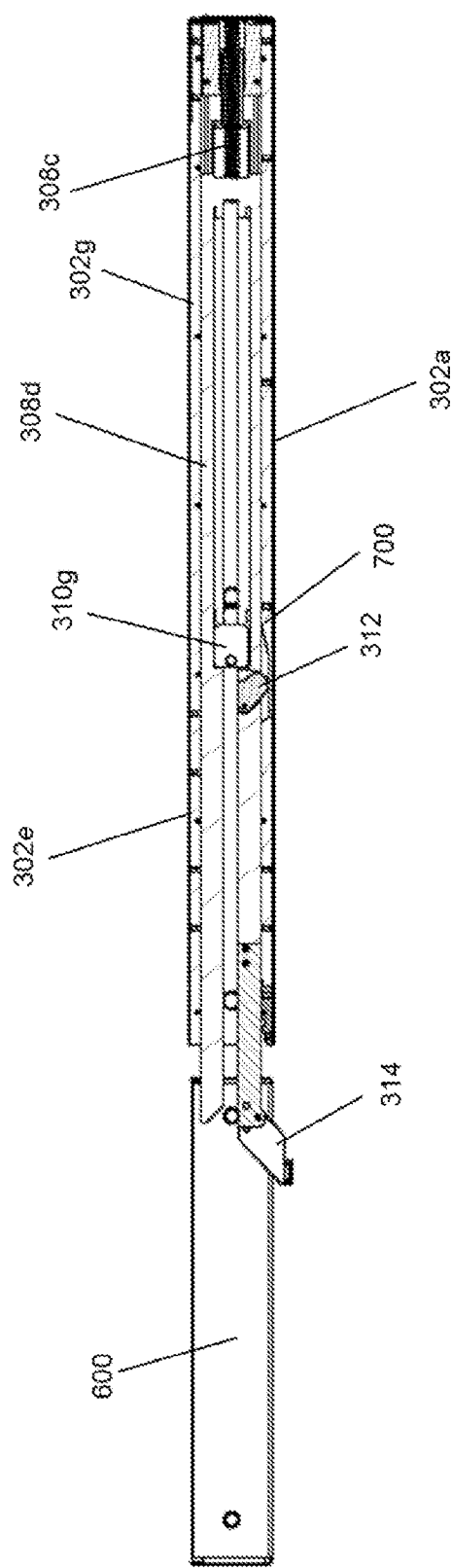
FIG. 7a is a side view illustrating a device being moved into the multi-device chassis of FIGS. 3a-3d.

Referring now to FIG. 6b, a half depth device 600 is positioned adjacent the first device slot 304 such that the rear of the half depth device 600 is located adjacent the first device entrance 304a, and a full depth device 602 is positioned adjacent the first device slot 304 such that the rear of the half depth device 600 is located adjacent the first device entrance 304a. The half depth device 600 and the full depth device 602 may then be moved through the first device entrance 304a and the second device entrance 306a, respectively, and into the first device slot 304 and the second device slot 306. FIG. 7a illustrates how features on the half depth device 600 may engage the channel 316 on the sliding rail 308d as the half depth device 600 is moved into the first device slot 304 to help guide the half depth device 600 into the first device slot 304, and one of skill in the art in possession of the present disclosure will recognize that the full depth device 602 may include similar features and operate in a similar manner when being moved into the second device slot 306.

Figure 6C:
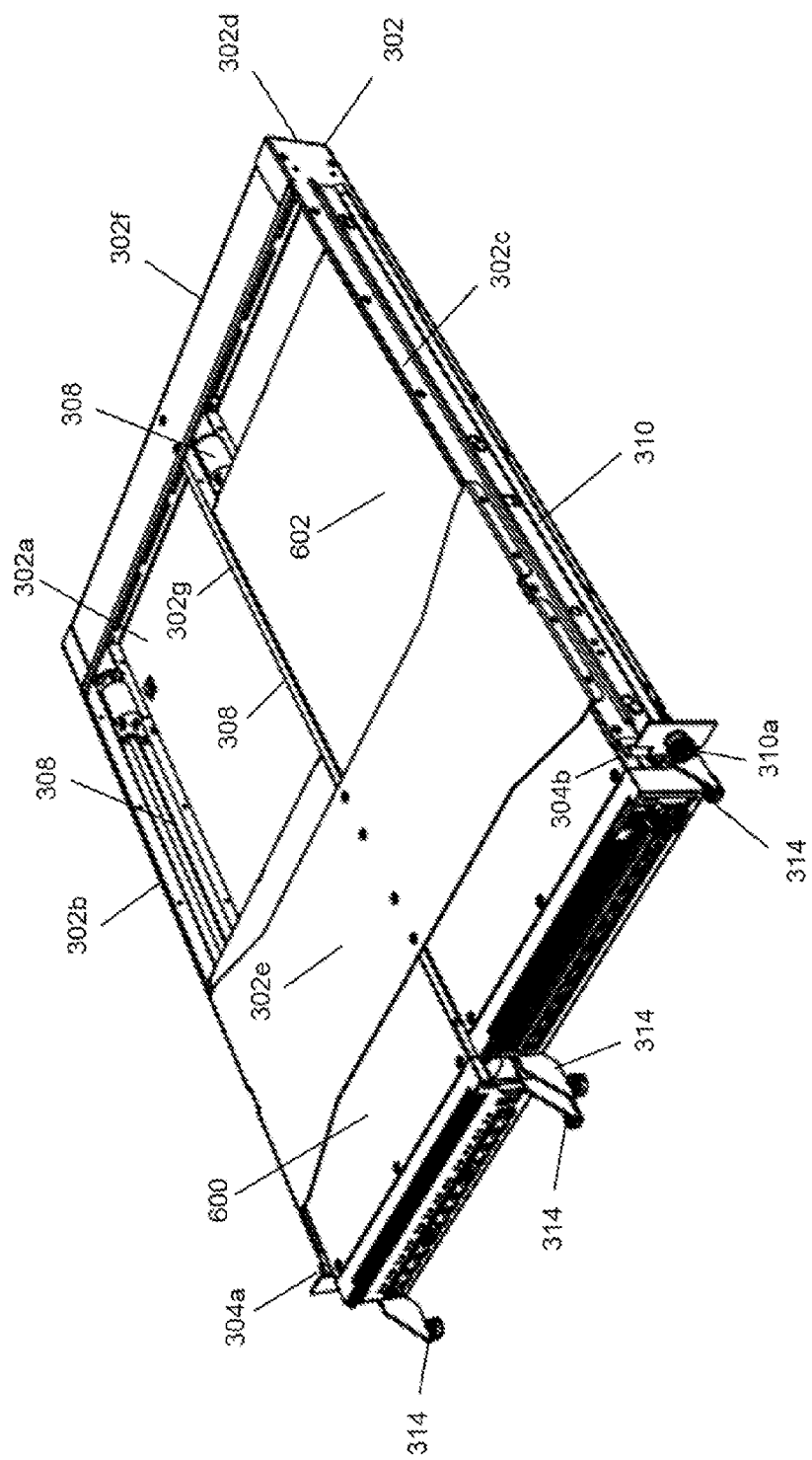
FIG. 6c is a perspective view illustrating devices being moved into the multi-device chassis of FIGS. 3a-3d.
Figure 6D:
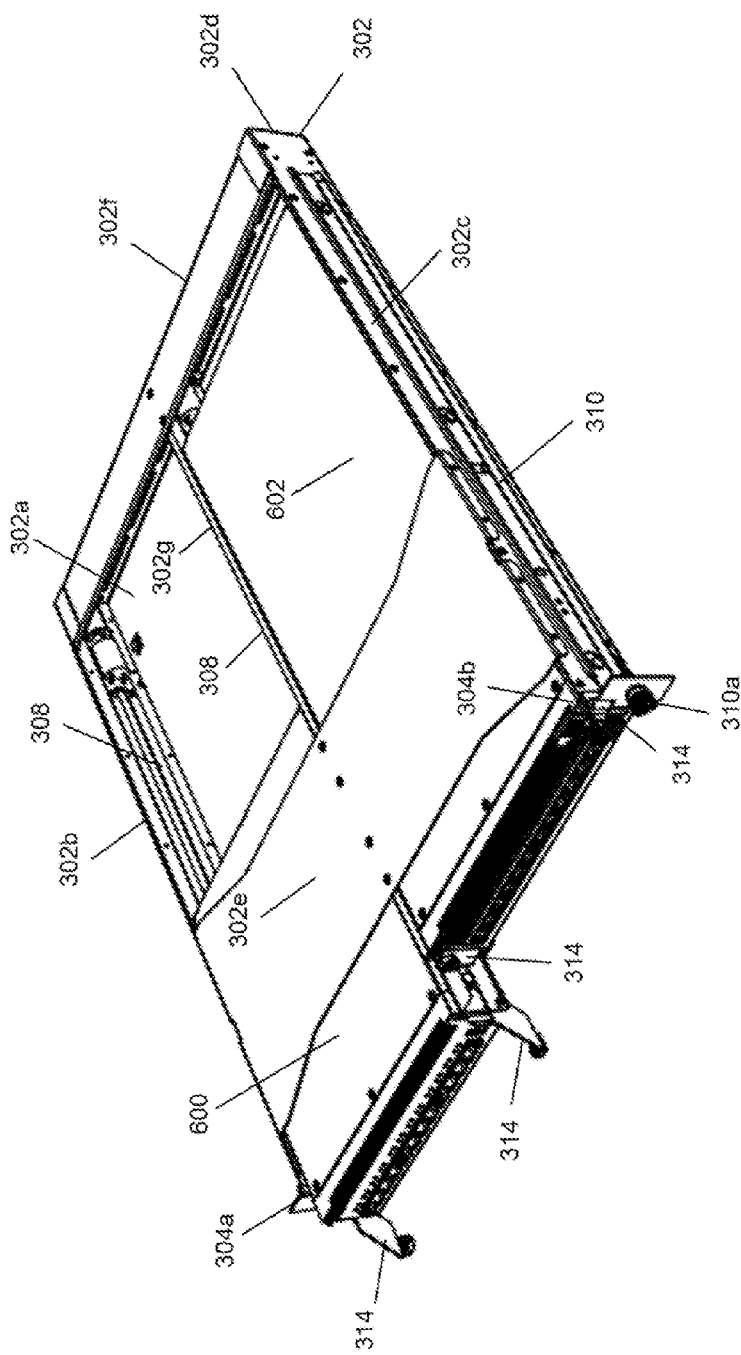
FIG. 6d is a perspective view illustrating a device being secured into the multi-device chassis of FIGS. 3a-3d.

Referring now to FIG. 6c, the half depth device 600 and the full depth device 602 are illustrated has substantially positioned in the first device slot 304 and the second device slot 306. In an embodiment, the positioning of the half depth device 600 and the full depth device 602 illustrated in FIG. 6c shows the half depth device 600 moved into the first device slot 304 such that the half depth device 600 engages the device stop members 310 but does not provide a force on the device stop members 310 that is transferred to the sliding rails 308d to compress the springs 308c, and shows the full depth device 602 moved into the second device slot 306 such that the full depth device 602 engages the device stop members 310 and provides a force on the device stop members 310 that is transferred to the sliding rails 308d to begin compressing the springs 308c (e.g., the user is pushing on the full depth device 602 and causing the springs 308c to compress.)

Figure 7B:
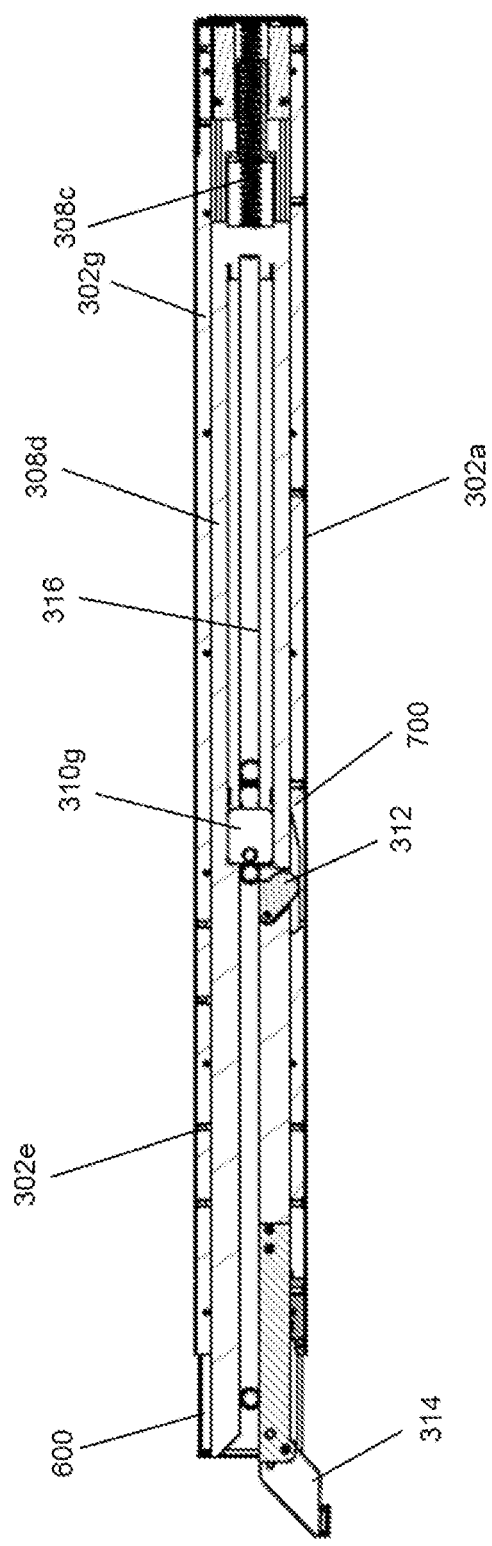
FIG. 7b is a side view illustrating a device being moved into the multi-device chassis of FIGS. 3a-3d.
Figure 7C:
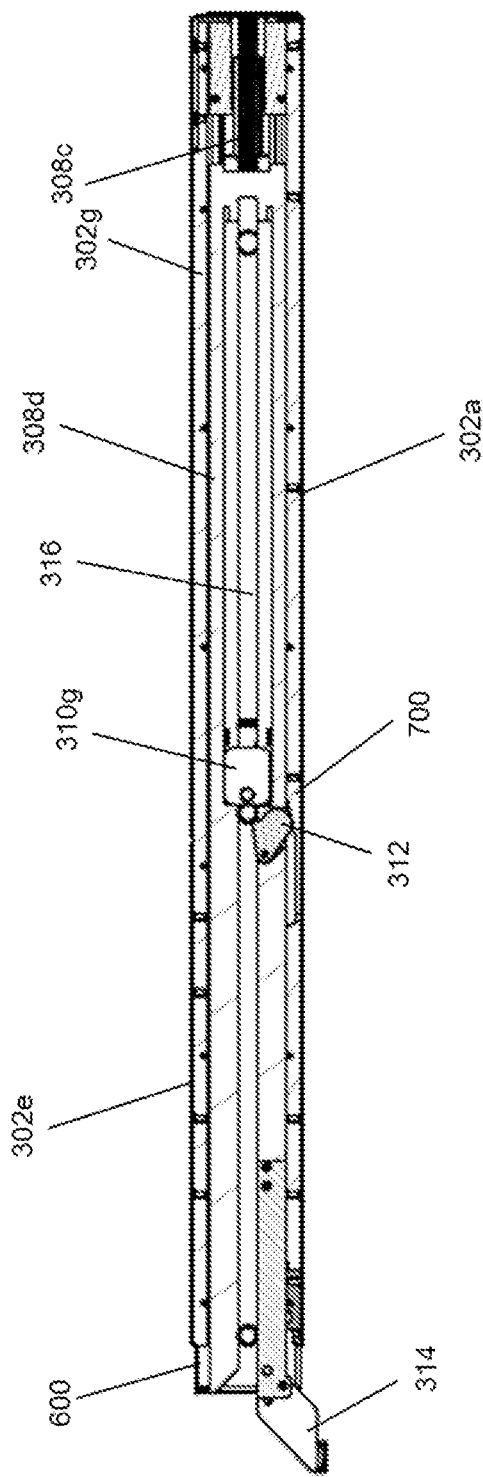
FIG. 7c is a side view illustrating a device being moved into the multi-device chassis of FIGS. 3a-3d.
Figure 7D:
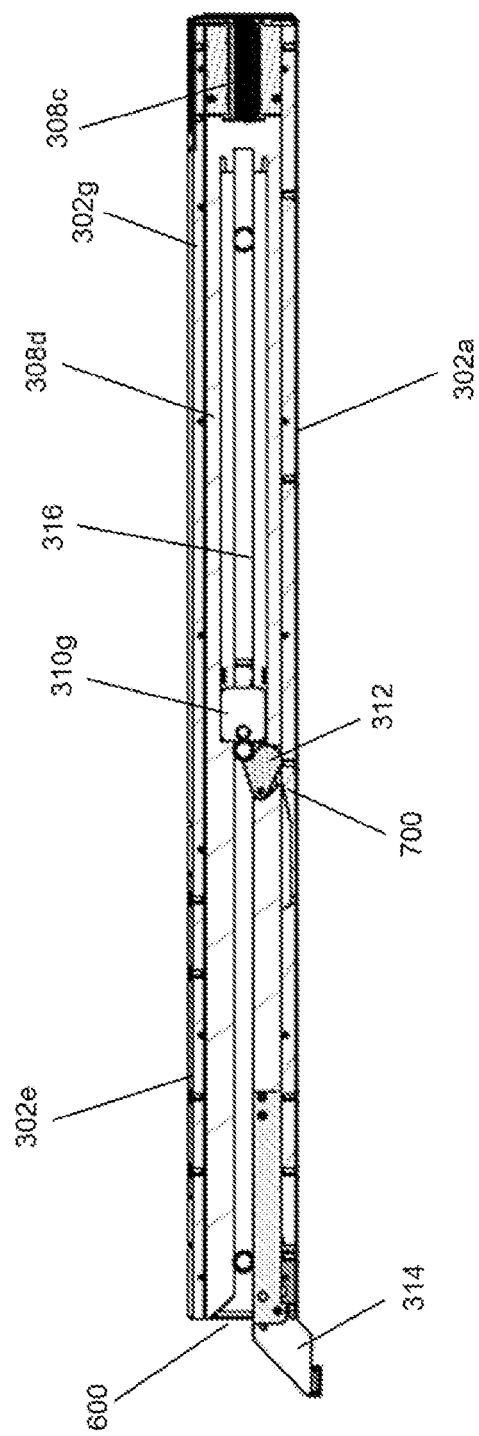
FIG. 7d is a side view illustrating a device being moved into the multi-device chassis of FIGS. 3a-3d.
Figure 8A:
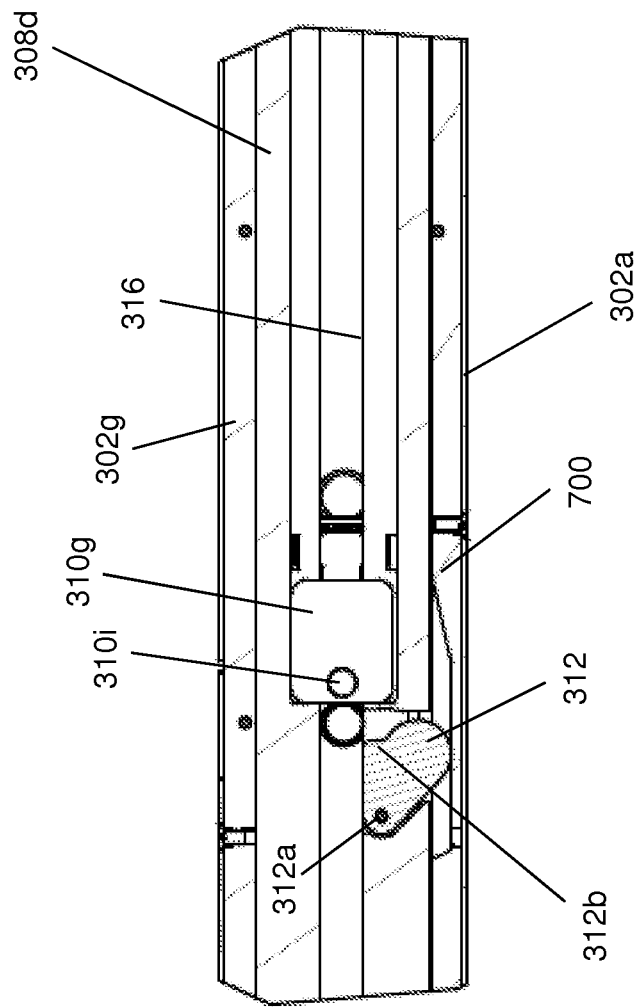
FIG. 8a is a side view illustrating a device being moved into the multi-device chassis of FIGS. 3a-3d.
Figure 8B:
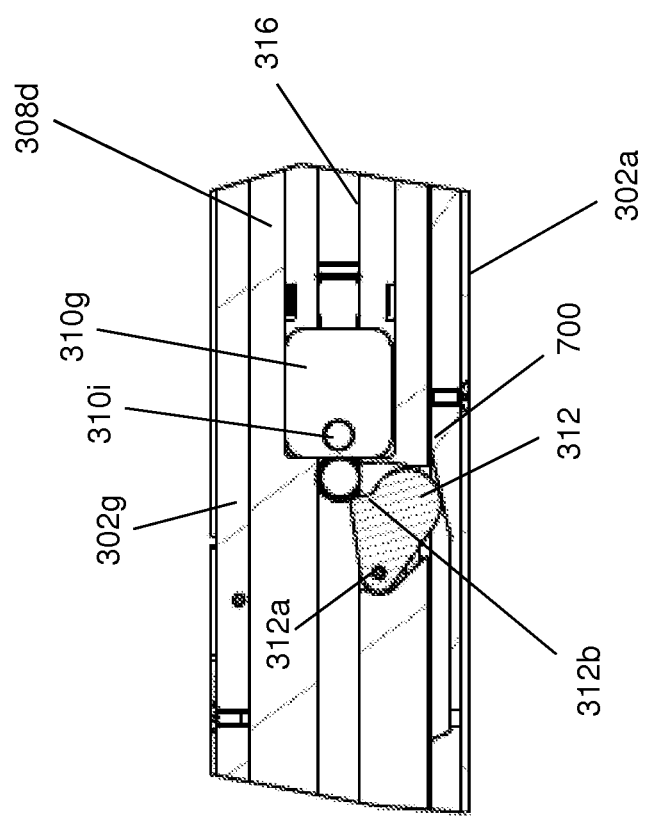
FIG. 8b is a side view illustrating a device being moved into the multi-device chassis of FIGS. 3a-3d.
Figure 9A:
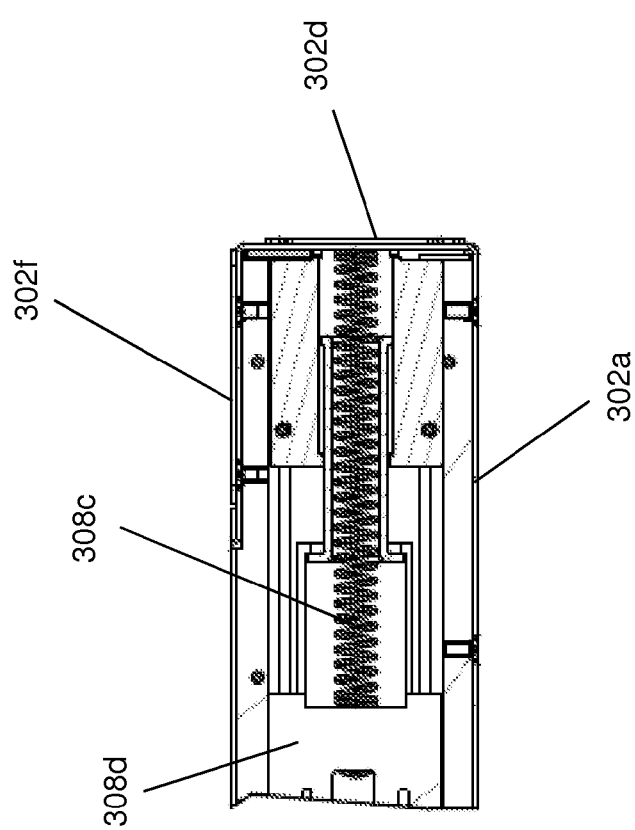
FIG. 9a is a side view illustrating a device being moved into the multi-device chassis of FIGS. 3a-3d.

Referring now to FIGS. 7a, 7b, 7c, 7d, 8a, 8b, 8c, 9a, 9b, and 9c, the movement of the half depth device 600 in the device slot 304 is illustrated and described. FIGS. 7b, 8a, and 9a illustrate the device chassis 300 as the half depth device 600 just begins to provide a force on the device stop members 310. As can be seen in FIGS. 7b and 8a, the device stop member 310 is configured for half depth devices (e.g., the slide plate 310g is positioned halfway along the length of the sliding rail 308d). In this position, the device retention member 312 is spaced apart from a device retention ramp 700 that is located on the bottom wall 302a of the device chassis 300. FIG. 9a illustrates the spring 308c just beginning to be compressed by the sliding rail 308d (through the force transmitted from the user, to the half depth device 600, to the device stop member 310, and to the sliding rail 308d).

Figure 9B:
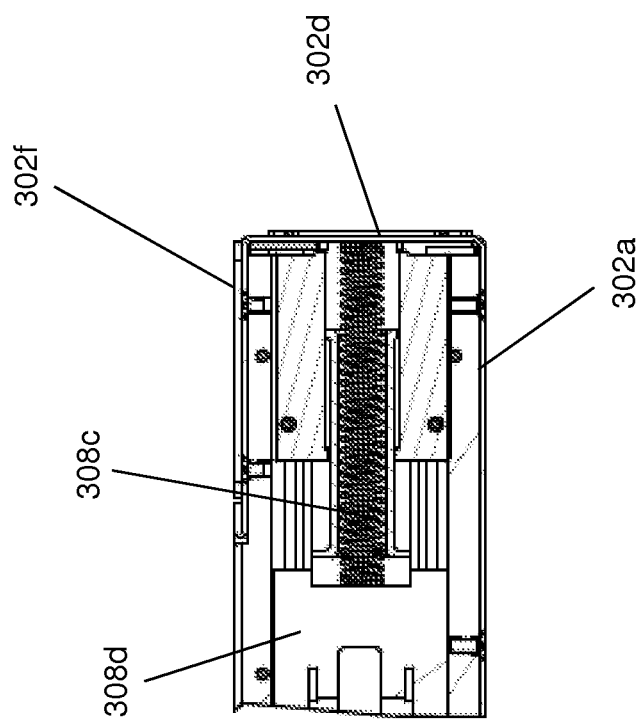
FIG. 9b is a side view illustrating a device being moved into the multi-device chassis of FIGS. 3a-3d.

FIGS. 7c, 8b, and 9b illustrate the device chassis 300 as the half depth device 600 is pushing the device stop members 310 through the first device slot 304. As can be seen in FIGS. 7c and 8b, the device retention member 312 has moved towards the device retention ramp 700 that is located on the bottom wall 302a of the device chassis 300, which causes the device retention member 312 to rotate about its pivotal connection 312a to the sliding rail 308d. FIG. 9b illustrates the spring 308c being further compressed by the sliding rail 308d (through the force transmitted from the user, to the half depth device 600, to the device stop member 310, and to the sliding rail 308d).

Figure 9C:
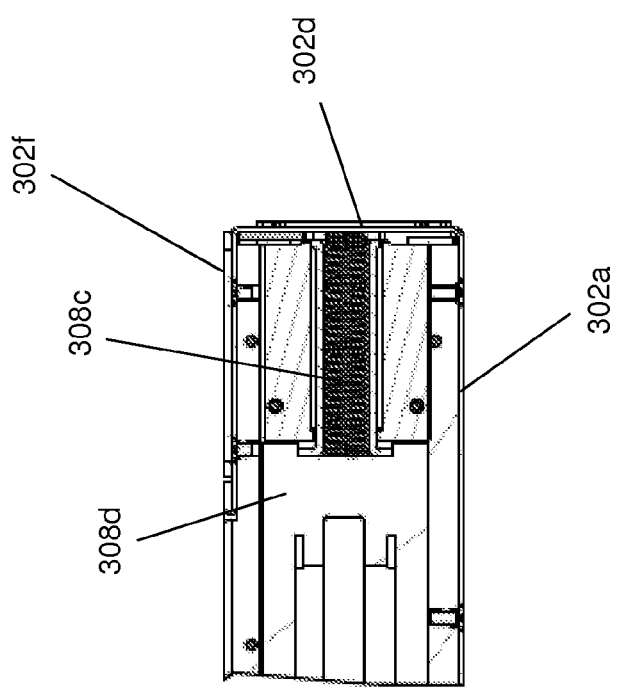
FIG. 9c is a side view illustrating a device secured in the multi-device chassis of FIGS. 3a-3d.

FIGS. 7d, 8c, and 9c illustrate the device chassis 300 as the half depth device 600 has become substantially fully positioned in the first device slot 304. As can be seen in FIGS. 7d and 8c, the device retention member 312 has moved up the device retention ramp 700 that is located on the bottom wall 302a of the device chassis 300, which causes the device retention member to further rotate about its pivotal connection 312a to the sliding rail 308d such that the device engagement surface 312b on the device retention member 312 engages the feature on the half depth device 600 that is located in the channel 316. With the device engagement surface 312b engaging the feature on the half depth device 600 that is located in the channel 316, the movement of the half depth device 600 towards the first device entrance 304a is resisted by the device retention member 312. FIG. 9c illustrates the spring 308c compressed by the sliding rail 308d (through the force transmitted from the user, to the half depth device 600, to the device stop member 310, and to the sliding rail 308d) when the half depth device 600 is substantially fully positioned in the first device slot 304. Referring to FIGS. 9a-c, a dampener may be provided on the spring 308c in order to control the force provided on the sliding rail 308d and thus the speed at which the sliding rail 308d moves the device out of the device slot.

Figure 10A:
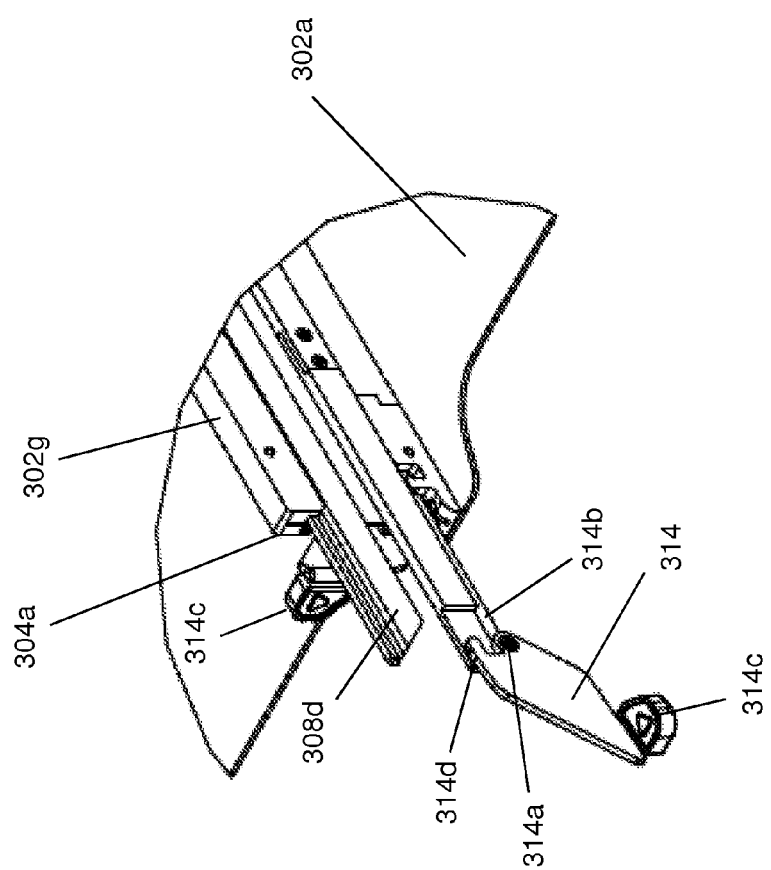
FIG. 10a is a perspective view illustrating a latch prior to a device being positioned in the multi-device chassis of FIGS. 3a-3d.
Figure 10B:
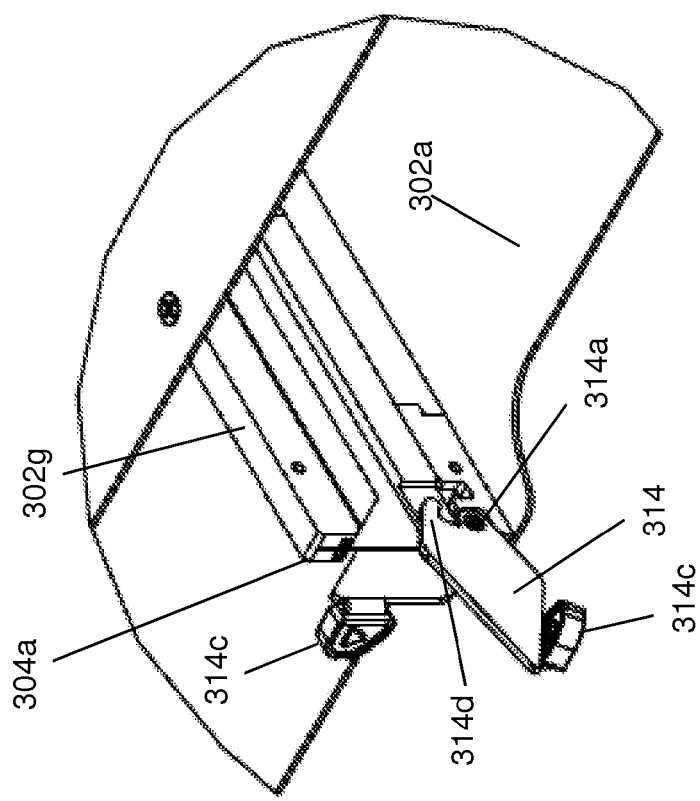
FIG. 10b is a perspective view illustrating a latch being operated to secure a device in the multi-device chassis of FIGS. 3a-3d.
Figure 10C:
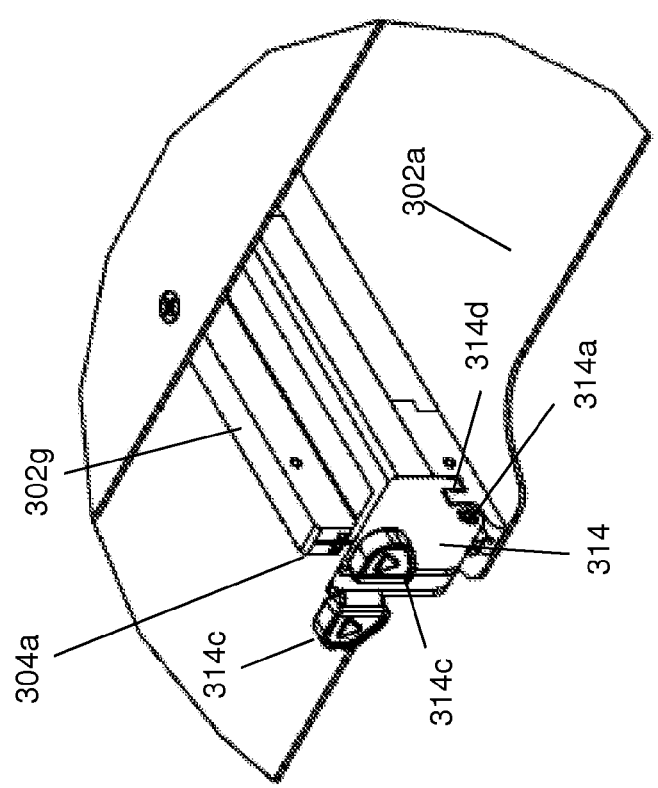
FIG. 10c is a perspective view illustrating a latch securing a device in the multi-device chassis of FIGS. 3a-3d.
Figure 11:
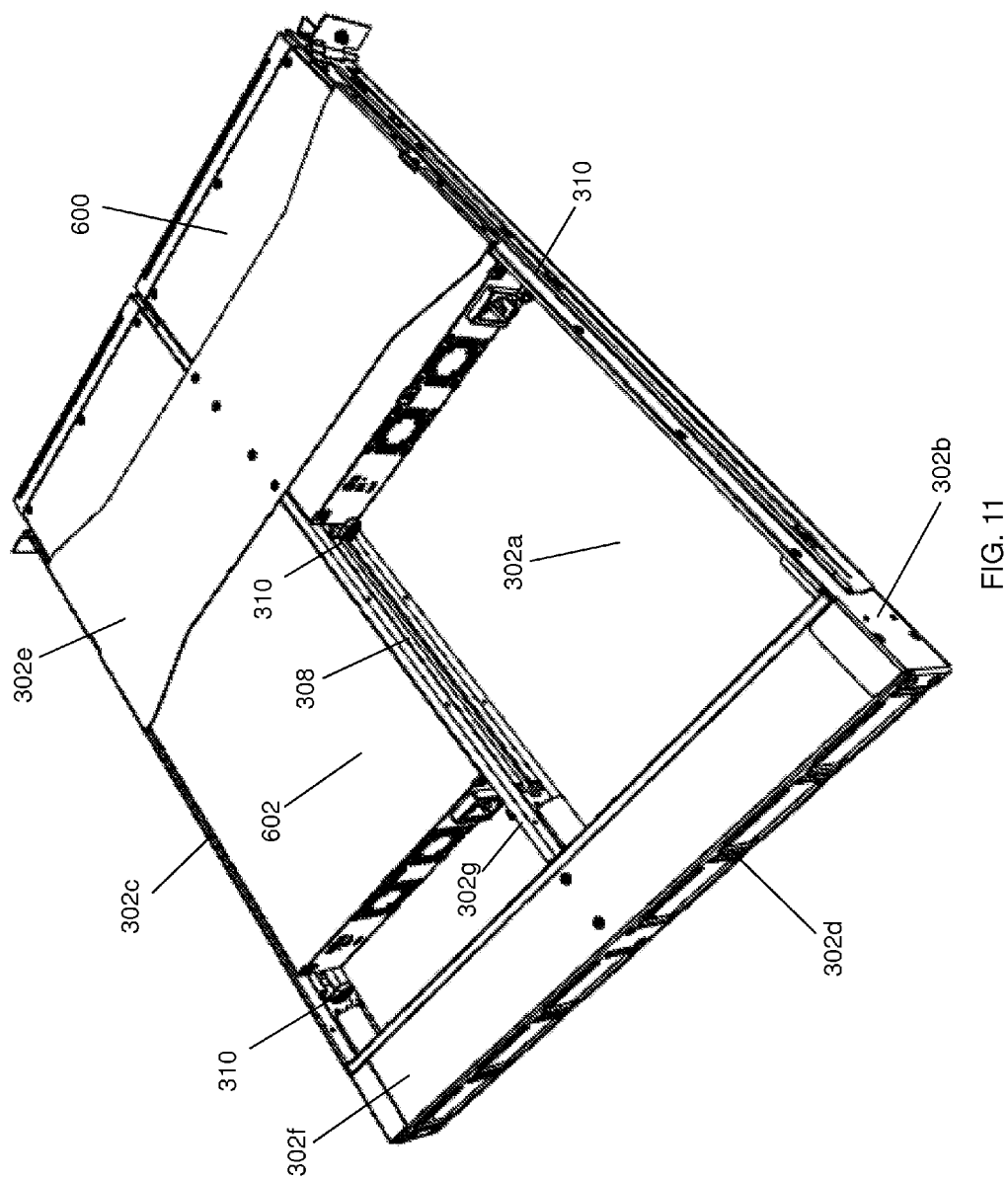
FIG. 11 is a perspective view illustrating devices secured in the multi-device chassis of FIGS. 3a-3b.

Referring now to FIGS. 10a, 10b, and 10c, the operation of the latch 314 is illustrated in detail. FIG. 10a illustrates the latch in an unlatched position (also illustrated in FIGS. 6a, 6b, 6c, 6d (for the half depth device 600), 7a, 7b, 7c, and 7d) with the end of the sliding rail 308d extending past the first device entrance 304a and the second device entrance 306a. FIG. 10b illustrates the sliding rail 308d no longer extended past the first device entrance 304a and the second device entrance 306a (e.g., when the device is substantially fully positioned in the device slot, as illustrated in FIG. 7d), and the latch partially rotated about the pivotal coupling 314a (e.g., using the handle 314c). FIGS. 10b and 10c illustrate how rotation of the latch 314 about the pivotal coupling causes the cam mechanism 314d to engage a feature on the device chassis 300. When the cam feature 314d is fully engaged with the feature on the device chassis 300 as illustrated in FIG. 10c, the movement of the sliding rail 308d relative to the device chassis 300 is resisted, thus securing the device in the device slot. One of skill in the art will recognize that activation of the latches 314 to secure the half depth device 600 and the full depth device 602 in the first device slot 304 and the second device slot 306, respectively, may slightly move each of the half depth device 600 and the full depth device 602 further into the first device slot 304 and the second device slot 306, respectively (thus moving the half depth device 600 and the full depth device 602 from being substantially fully positioned in the first device slot 304 and the second device slot 306, respectively, to being fully positioned in the first device slot 304 and the second device slot 306.) FIG. 11 illustrates a view of each of the half depth device 600 and the full depth device fully positioned in first device spot 304 and the second device slot 306.

Figure 6E:
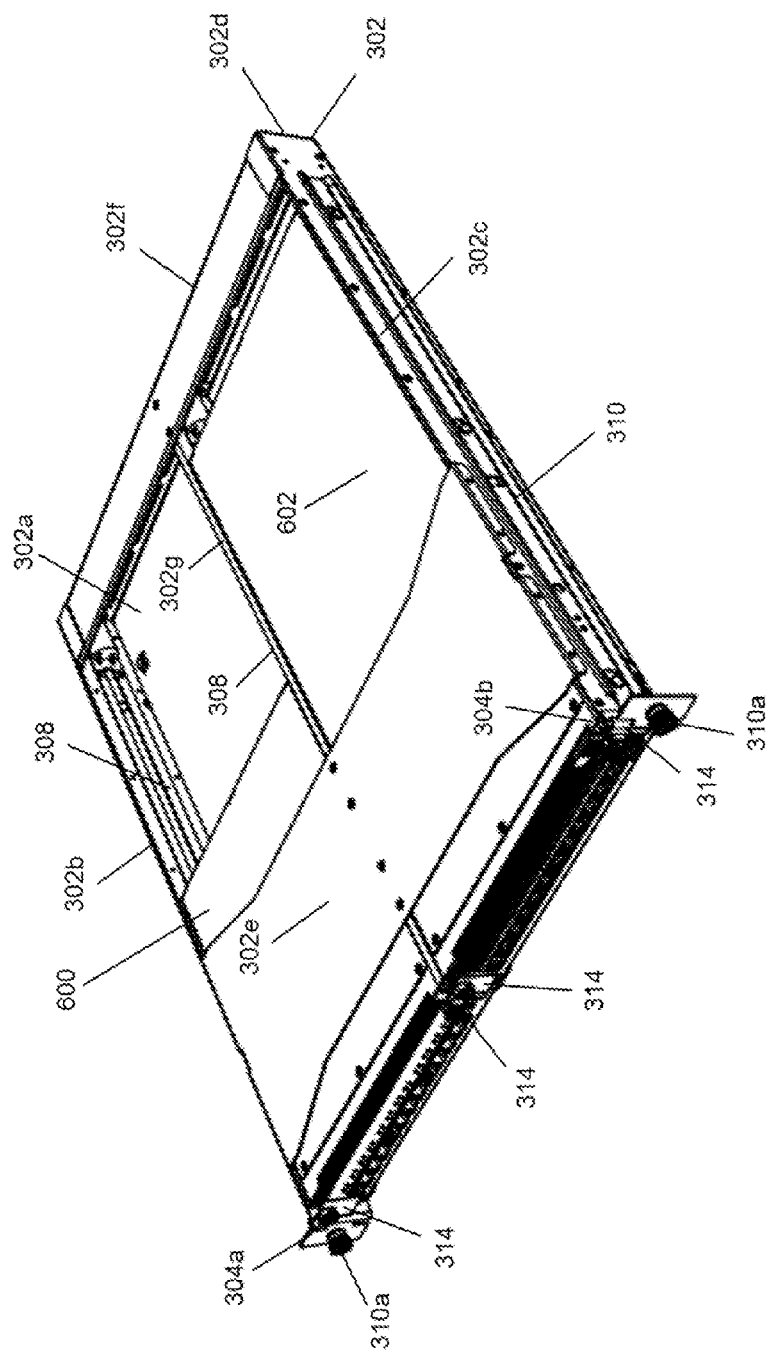
FIG. 6e is a perspective view illustrating a device being secured into the multi-device chassis of FIGS. 3a-3d.
Figure 7E:
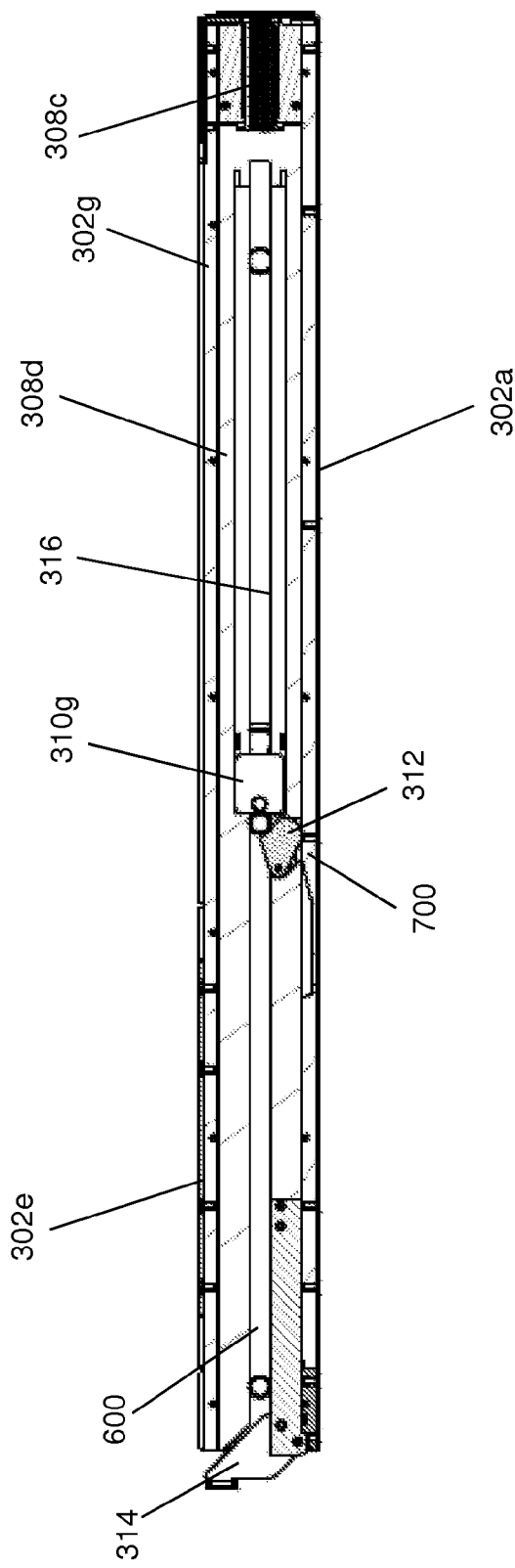
FIG. 7e is a side view illustrating a device being secured into the multi-device chassis of FIGS. 3a-3d.

The method 400 then proceeds to block 408 where device(s) are removed from the device chassis. In an embodiment, devices may be removed from a device slot in the device chassis 300 by deactivating the latches 310 that resist movement of the sliding rails 308d adjacent that device slot. For example, referring to FIGS. 10a, 10b, and 10c, the latch may be deactivated from the latched position illustrated in FIG. 10c (with the cam mechanism 314d engaging the feature on the device chassis 300) by engaging the handle 314c to rotate the latch 314 to the position illustrated in FIG. 10b such that the cam mechanism 314d disengages the feature on the device chassis 300. Disengagement of the cam mechanism 314d and the feature on the device chassis 300 removes the counteracting force on the spring 308c such that the biasing force from the spring 308c on the sliding rail 308d may move the sliding rail 308d from the position illustrated in FIGS. 7d and 9c, to the position illustrated in FIGS. 7c and 9b, and to the position illustrated in FIGS. 7b and 9a. Movement of the sliding rails 308d results in the handles 310f on the device stop members 310 transferring the biasing force from the spring 308c to the device in their associated device slot. As such, release of the latches 310 on each side of a device that is located in a device slot on the device chassis 300 causes the device to be moved through the device entrance of that device slot. For example, FIGS. 6e and 7e illustrate the half depth device 600 secured in the first device slot 304 with the latches 314 in the latched position. FIGS. 6d and 7d, 7c, and 7b (in that order), illustrate how unlatching the latches 314 causes the spring to provide the biasing force and move the half depth device 600 through the first device entrance 304a on the first device slot 304. As such, a user may then easily grasp the half depth device 600 and completely remove it from the first device slot 304. One of skill in the art will recognize that the full depth device 602 may be removed from the device chassis 300 in substantially the same manner (i.e., via release of the latches 314 to have the full depth device 602 moved via the spring biasing force out of the second device entrance 306a).

Thus, a multi-device coupling system has been described that allows for multiple devices having different depths to be positioned side-by-side in a rack slot and secured in the rack, while providing for movement of each of those devices out of the rack slot when the devices are unsecured (e.g., via a latch) to allow a user to easily grasp the device and remove it from the rack slot. As such, rack slots may be optimized with both full depth devices and half depth device (or other less-than-full depth devices), rather than having to dedicate one rack slot to only half width, full depth devices and dedicate another rack slot to only half width, half depth devices. While the systems and methods above have been described as being used with information handling systems and other computing devices, the functionality of the multi-device chassis may be used to couple a container to the multi-device chassis. For example, a first slot in the multi device chassis may be used to couple an IHS to the multi-device chassis, while a second slot in the multi-device chassis may be used to couple a container to the multi-device chassis for the storage of tools, documentation, spare parts, etc.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi device system, comprising:
   a rack that defines a rack slot;
   a device chassis that is positioned in the rack slot, wherein the device chassis defines a first device slot that includes a first device entrance, and wherein the device chassis defines a second device slot that includes a second device entrance and that is located adjacent the first device slot;
   a first sliding rail that is moveably coupled to the device chassis and located adjacent the first device slot;
   a first device stop member that is moveably coupled to the first sliding rail, extends into the first device slot, and is securable in a plurality of different locations along the first sliding rail such that a distance between the first device stop member and the first device entrance is adjustable, wherein the first device stop member is configured to move a first device that is positioned in the first device slot through the first device entrance;
   a second sliding rail that is moveably coupled to the device chassis and located adjacent that second device slot; and
   a second device stop member that is movably coupled to the second sliding rail, extends into the second device slot, and is securable in a plurality of different locations along the second sliding rail such that a distance between the second device stop member and the second device entrance is adjustable, wherein the second device stop member is configured to move a second device that is positioned in the second device slot through the second device entrance.

2. The system of claim 1, further comprising:
   a rear wall that is located on the device chassis opposite the first device slot from the first device entrance and opposite the second device slot from the second device entrance, wherein the distance between the first device stop member and the first device entrance is adjustable from a position that is adjacent the rear wall to a position that is approximately halfway between the first device entrance and the rear wall, and wherein the distance between the second device stop member and the second device entrance is adjustable from a position that is adjacent the rear wall to a position that is approximately halfway between the second device entrance and the rear wall.

3. The system of claim 1, further comprising:
   a first spring that provides a force on the first sliding rail that is configured to cause the first device stop member to move the first device through the first device entrance when the first device stop member is secured to one of the plurality of different locations along the first sliding rail; and
   a second spring that provides a force on the second device stop member that is configured to cause the second device stop member to move the second device through the second device entrance when the second device stop member is secured to one of the plurality of different locations along the second sliding rail.

4. The system of claim 1, further comprising:
   a first latch that is coupled to the first sliding rail and that is configured to engage the device chassis to resist movement of the first sliding rail relative to the device chassis; and
   a second latch that is coupled to the second sliding rail and that is configured to engage the device chassis to resist movement of the second sliding rail relative to the device chassis.

5. The system of claim 4, wherein the first latch includes a first cam mechanism that is configured to engage the device chassis, and wherein the second latch includes a second cam mechanism that is configured to engage the device chassis.

6. The system of claim 1, further comprising:
   a first device retention member that is coupled to the first sliding rail and that is configured to engage the first device in response to movement of the first sliding rail into the first device slot; and
   a second device retention member that is coupled to the second sliding rail and that is configured to engage the second device in response to movement of the second sliding rail into the second device slot.

7. A multi-device coupling system, comprising:
   a multi-device chassis that defines a first device slot and a second device slot in a side-by-side orientation;
   a first sliding rail that is moveably coupled to the multi-device chassis and located adjacent the first device slot
   a first device stop member that is moveably coupled to the first sliding rail, extends into the first device slot, and is securable in a plurality of different locations along the first sliding rail such that a location of the first device stop member along a length of the first device slot is adjustable, and wherein the first device stop member is configured to move a first device that is positioned in the first device slot out of the first device slot;
   a second sliding rail that is moveably coupled to the multi-device chassis and located adjacent the second device slot; and
   a second device stop member that is moveably coupled to the second sliding rail, extends into the second device slot, and is securable in a plurality of different locations along the second sliding rail such that a location of the second device stop member along a length of the second device slot is adjustable, and wherein the second device stop member is configured to move a second device that is positioned in the second device slot out of the second device slot.

8. The system of claim 7, wherein the location of the first device stop member along the length of the first device slot is adjustable from a position that is adjacent an end of the first device slot to a position that is approximately in the middle of the first device slot, and wherein the location of the second device stop member along the length of the second device slot is adjustable from a position that is adjacent an end of the second device slot to a position that is approximately in the middle of the second device slot.

9. The system of claim 7, further comprising:
a first spring that provides a force on the first sliding rail that is configured to cause the first device stop member to move the first device out of the first device slot when the first device stop member is secured to one of the plurality of different locations along the first sliding rail; and
a second spring that provides a force on the second device stop member that is configured to cause the second device stop member to move the second device out of the second device slot when the second device stop member is secured to one of the plurality of different locations along the second sliding rail.

10. The system of claim 7, further comprising:
a first latch that is coupled to the first sliding rail and that is configured to engage the multi-device chassis to resist movement of the first sliding rail relative to the multi-device chassis; and
a second latch that is coupled to the second sliding rail and that is configured to engage the multi-device chassis to resist movement of the second sliding rail relative to the multi-device chassis.

11. The system of claim 10, wherein the first latch includes a first cam mechanism that is configured to engage the multi-device chassis, and wherein the second latch includes a second cam mechanism that is configured to engage the multi-device chassis.

12. The system of claim 7, further comprising:
a first device retention member that is coupled to the first sliding rail and that is configured to engage the first device in response to movement of the first sliding rail into the first device slot; and
a second device retention member that is coupled to the second sliding rail and that is configured to engage the second device in response to movement of the second sliding rail into the second device slot.

13. A method for coupling devices to a chassis, comprising:
adjusting, along a length of a first device slot that is defined by a device chassis that also defines a second device slot in a side-by-side orientation with the first device slot, a first device stop member that extends into the first device slot from a movable coupling to a first sliding rail that is movably coupled to the device chassis and located adjacent the first device slot;
securing the first device stop member in one of a plurality of locations along the first sliding rail;
adjusting, along a length of the second device slot, a second device stop member that extends into the second device slot from a moveable coupling to a second sliding rail that is movably couple to the device chassis and located adjacent the second device slot;
securing the second device stop member in one of a plurality of locations along the second sliding rail;
positioning a first device in the first device slot;
positioning a second device in a second device slot;
moving the first device out of the first device slot using the first device stop member; and
moving the second device out of the second device slot using the second device stop member.

14. The method of claim 13, wherein the first device stop member is adjusted between a position that is adjacent an end of the first device slot and a position that is approximately in the middle of the first device slot, and wherein the second device stop member is adjusted between a position that is adjacent an end of the second device slot and a position that is approximately in the middle of the second device slot.

15. The method of claim 13, further comprising:
providing a spring force on the first sliding rail that causes the first device stop member to move the first device out of the first device slot when the first device stop member is secured to one of the plurality of locations along the first sliding rail; and
providing a spring force on the second sliding rail that causes the second device stop member to move the second device out of the second device slot when the second device stop member is secured to one of the plurality of locations along the second sliding rail.

16. The method of claim 13, further comprising:
resisting movement of the first sliding rail relative to the device chassis by engaging the device chassis with a latch that is coupled to the first sliding rail; and
resisting movement of the second sliding rail relative to the device chassis by engaging the device chassis with a latch that is coupled to the second sliding rail.

17. The method of claim 13, further comprising:
engaging the first device with a first device retention member on the first sliding rail in response to movement of the first sliding rail into the first device slot; and
engaging the second device with a second device retention member on the second sliding rail in response to movement of the second sliding rail into the second device slot.

* * * * *